(12) United States Patent
Burke

(10) Patent No.: US 11,482,616 B2
(45) Date of Patent: Oct. 25, 2022

(54) METHODS AND STRUCTURES FOR CONTACTING SHIELD CONDUCTOR IN A SEMICONDUCTOR DEVICE

(71) Applicant: SEMICONDUCTOR COMPONENTS INDUSTRIES, LLC, Phoenix, AZ (US)

(72) Inventor: Peter A. Burke, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 153 days.

(21) Appl. No.: 17/248,008

(22) Filed: Jan. 5, 2021

(65) Prior Publication Data
US 2022/0216336 A1 Jul. 7, 2022

(51) Int. Cl.
*H01L 29/78* (2006.01)
*H01L 29/66* (2006.01)
*H01L 29/423* (2006.01)

(52) U.S. Cl.
CPC ...... *H01L 29/7813* (2013.01); *H01L 29/4236* (2013.01); *H01L 29/66734* (2013.01)

(58) Field of Classification Search
CPC ............. H01L 29/7813; H01L 29/4236; H01L 29/66734

USPC .......................................................... 257/330
See application file for complete search history.

(56) References Cited

U.S. PATENT DOCUMENTS

| | | | |
|---|---|---|---|
| 2012/0292694 A1* | 11/2012 | Hsieh ..................... | H01L 29/407 438/270 |
| 2015/0311295 A1 | 10/2015 | Lee et al. | |
| 2021/0020567 A1* | 1/2021 | Hu ........................ | H01L 24/20 |
| 2021/0028305 A1* | 1/2021 | Hsieh ................ | H01L 29/66734 |

* cited by examiner

*Primary Examiner* — Igwe U Anya
(74) *Attorney, Agent, or Firm* — Kevin B. Jackson

(57) ABSTRACT

A semiconductor device includes a region of semiconductor material comprising a major surface and a first conductivity type and a shielded-gate trench structure. The shielded-gate trench structure includes an active trench, an insulated shield electrode in the lower portion of the active trench; an insulated gate electrode adjacent to the gate dielectric in an upper portion of the active trench; and an inter-pad dielectric (IPD) interposed between the gate electrode and the shield electrode. An interlayer dielectric (ILD) structure is over the major surface. A conductive region is within the active trench and extends through the ILD structure, the gate electrode, and the IPD, and is electrically connected to the shield electrode. The conductive region is electrically isolated from the gate electrode by a dielectric spacer. The gate electrode comprises a shape that surrounds the conductive region in a top view so that the gate electrode is uninterrupted by the conductive region and the dielectric spacer.

20 Claims, 23 Drawing Sheets

METHODS AND STRUCTURES FOR CONTACTING SHIELD CONDUCTOR IN A SEMICONDUCTOR DEVICE

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, decreased reliability, relatively low performance including poor switching performance, or dimensions that are too large. Further limitations and disadvantages of conventional and traditional approaches will become apparent to one of skill in the art, through comparison of such approaches with the present disclosure and reference to the drawings.

Figure 1:
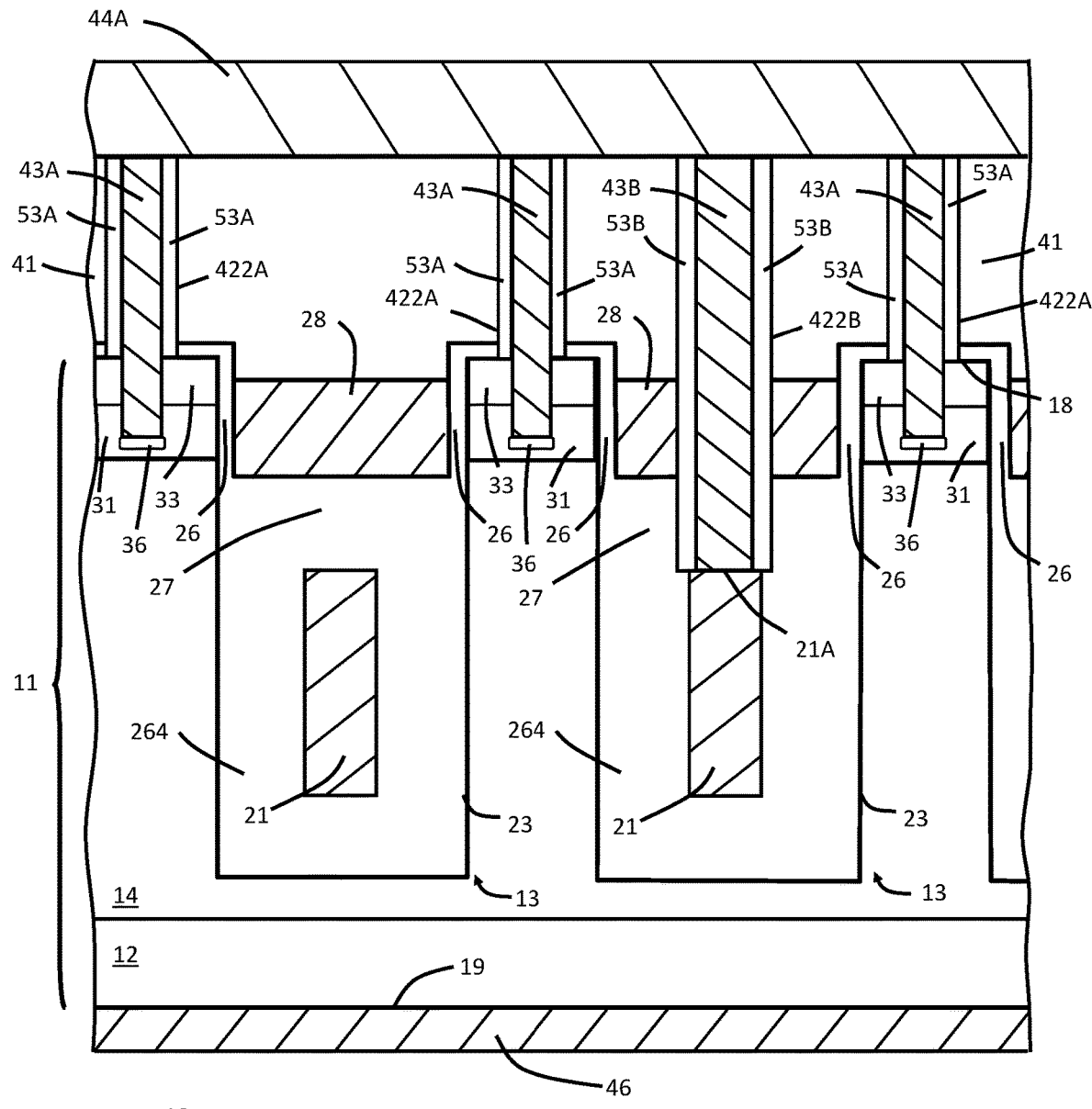
FIG. 1 illustrates a cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

Insulated gate field effect transistor (IGFET) devices are widely used in power applications. A trench metal-oxide-semiconductor FET (MOSFET) device is a type of IGFET device used in such applications. Certain trench MOSFET devices include a shield electrode electrically isolated from a gate electrode within the same trench (shielded-gate trench MOSFET), and can be used in power conversion applications, such as synchronous BUCK converter circuits. The power conversion efficiency in circuits, such as synchronous BUCK converters is dependent upon many factors including the frequency of the switching of the trench MOSFETs used in the application. As frequency of the BUCK converters is increased, the more important shield resistance (lower is better) and the overall capacitance (lower is better) of the MOSFETs become in the desired device efficiency. A contrary issue to low shield resistance (R-shield or Rs) and to low overall capacitances (QOSS, Qg, Qgd) is an unwanted increase in switch node ringing, which is caused by high frequency switching speed of, for example, a high-side MOSFET device. Being able to control R-shield independently by location within the trench MOSFET device would be helpful to reduce this effect.

Accordingly, what is needed is cost-effective methods and structures for achieving lower shield resistance (Rs), balanced with the gate resistance (R-gate or Rg) by adding large numbers of gate-feeds and shield feeds to the MOSFET designs (as a means of lowering Rg and Rs). It would beneficial to accomplish this without significantly increasing the device capacitances. In addition, it would be advantageous to be able adjust Rs to more closely match Rg for a given application, and to be able to enable areas of higher Rs and lower Rs within a given device to address efficiency and ringing issues with some control of Rs at a local level.

In general, the present examples relate to semiconductor device structures and methods of making semiconductor devices that have reduced shield resistance thereby improving the switching performance of the semiconductor device. In addition, the structures and methods provide for reducing the shield electrode resistance in a controlled manner, which does not have to be uniform across the active area of the semiconductor device. The shield resistance can be tuned in accordance with specific application and design requirements. The structures and methods are cost effective to implement, which in some examples, only adds one mask layer and an etch step. It was found empirically that structures and methods of the present description have lower shield resistance compared to previous devices, which improves power conversion efficiency in power conversion applications, such as buck-converter applications.

In accordance with the present description, contact to the shield electrode is made interposed between source-metal areas of a MOSFET device. In some examples, contact to the shield electrode is made by making an electrically isolated contact through the gate conductor in the active area of the MOSFET device. In some examples, recesses are periodically provided along gate conductor structures, such as striped gate conductors in a manner that does not interrupt electrical communication of the gate conductor structure. More particularly stated, insulated shield contact regions are placed at predetermined locations of the gate conductor structures, and can comprise recesses extending through the gate conductor to the shield electrode. Portions of the gate conductor remain on at least one side of the recesses in a cross-sectional view. In this way, the gate conductor is only partially interrupted by the shield conductor. In some examples, a sufficient amount of gate conductor remains on both sides of the recesses in the cross-sectional view. In this way, the gate conductor provides channel control on both sides of the trench where source and body regions are located. The shield conductor is then provided within the recesses and is isolated from the gate conductor by an insulator. In some examples, the insulator comprises a spacer.

More particularly, in an example, a semiconductor device includes a region of semiconductor material comprising a first major surface and a first conductivity type and a shielded-gate trench structure. The shielded-gate trench structure includes an active trench extending from the first major surface into the region of semiconductor material; a shield dielectric layer adjacent to a lower portion of the active trench; a shield electrode adjacent to the shield dielectric layer in the lower portion of the active trench; a gate dielectric adjacent to an upper portion of the active trench; a gate electrode adjacent to the gate dielectric in the upper portion of the active trench; and an inter-pad dielectric (IPD) interposed between the gate electrode and the shield electrode. A body region of a second conductivity type opposite to the first conductive type is in the region of semiconductor material and extends from the major surface adjacent to the shielded-gate trench structure. A source region of the first conductivity type is in the body region adjacent to the shielded-gate trench structure. An interlayer dielectric (ILD) structure is over the first major surface; and a first conductive region is within the active trench and extends through the ILD structure, the gate electrode, and the IPD, wherein the first conductive region is coupled to the shield electrode; the first conductive region is electrically isolated from the gate electrode by a first dielectric spacer; and the gate electrode comprises a shape that surrounds the first conductive region in a top view so that gate electrode is uninterrupted by the first conductive region and the first dielectric spacer.

In an example, a semiconductor device includes a semiconductor device including a region of semiconductor material comprising a first major surface and a first conductivity type and a shielded-gate trench structure. The shielded-gate trench structure includes an active trench extending from the first major surface into the region of semiconductor material and having a first side and a second side opposite to the first side; a shield dielectric layer adjacent to a lower portion of the active trench; a shield electrode adjacent to the shield dielectric layer in the lower portion of the active trench; a gate dielectric adjacent to an upper portion of the active trench; a gate electrode adjacent to the gate dielectric in the upper portion of the active trench; and an inter-pad dielectric (IPD) interposed between the gate electrode and the shield electrode. A body region of a second conductivity type opposite to the first conductive type is in the region of semiconductor material extending from the major surface adjacent to the first side and the second side of the active trench. A source region of the first conductivity type is in the body region adjacent to the first side and the second side of the active trench. An interlayer dielectric (ILD) structure is over the first major surface. A first conductive region is within the active trench and extends through the ILD structure, the gate electrode, and the IPD. A second conductive region extends through the ILD structure and the source region. The first conductive region is coupled to the shield electrode; the first conductive region is electrically isolated from the gate electrode by a first dielectric spacer; and the gate electrode comprises a shape in a top view that surrounds each side of the first conductive region in the top view.

In an example, a method of forming a semiconductor device includes providing a region of semiconductor material comprising a first major surface and a first conductivity type. The method includes providing a shielded-gate trench structure including an active trench extending from the first major surface into the region of semiconductor material and having a first side and a second side opposite to the first side; a shield dielectric layer adjacent to a lower portion of the active trench; a shield electrode adjacent to the shield dielectric layer in the lower portion of the active trench; a gate dielectric adjacent to an upper portion of the active trench; a gate electrode adjacent to the gate dielectric in the upper portion of the active trench; and an inter-pad dielectric (IPD) interposed between the gate electrode and the shield electrode. The method includes providing a body region of a second conductivity type opposite to the first conductive type in the region of semiconductor material extending from the major surface adjacent to the first side and the second side of the active trench. The method includes providing a source region of the first conductivity type in the body region adjacent to the first side and the second side of the active trench. The method includes providing an interlayer dielectric (ILD) structure over the first major surface. The method includes providing a first conductive region within the active trench and extending through the ILD structure, the gate electrode, and the IPD. The method includes providing a second conductive region extending through the ILD structure and the source region, wherein the first conductive region is coupled to the shield electrode; the first conductive region is electrically isolated from the gate electrode by a first dielectric spacer; and the gate electrode comprises a shape in a top view that surrounds each side of the first conductive region in the top view.

Other examples are included in the present disclosure. Such examples may be found in the figures, in the claims, or in the description of the present disclosure.

FIG. 1 illustrates an enlarged cross-sectional view of an electronic device 10, a semiconductor device 10, or a shielded-gate trench MOSFET 10 having shielded-gate trench structures 13 in accordance with the present description. In some examples, shielded-gate trench structures 13 can be placed in an active region of semiconductor device 10. In some examples, semiconductor device 10 comprises a work piece 11, such as a region of semiconductor material 11 having a major surface 18 and an opposing major surface 19. In some examples, major surface 18 is configured as an active surface of semiconductor device 10. Region of semiconductor material 11 can include a bulk semiconductor substrate 12, such as an N-type conductivity silicon substrate having a resistivity in a range from about 0.001 ohm-cm to about 0.005 ohm-cm. By way of example, substrate 12 can be doped with phosphorous, arsenic, or antimony. In the example illustrated, substrate 12 provides a drain region, drain contact, or a first current carrying contact for device 10 typically at major surface 19. In some examples, the drain contact can made at major surface 18. In the present example, semiconductor device 10 is configured at a vertical MOSFET structure, but this description applies as well to insulated gate bipolar transistors (IGBT), MOS-gated thyristors, and other related or equivalent structures as known to one of ordinary skill in the art.

In some examples, region of semiconductor material 11 further includes a semiconductor layer 14, doped region 14, doped layer 14, or doped layers 14, which can be formed in, on, or overlying substrate 12. In one example, semiconductor layer 14 can be an N-type conductivity region or layer when substrate 12 is N-type conductivity, and can be formed using epitaxial growth techniques, ion implantation and diffusion techniques, other techniques as known to one of ordinary skill in the art, or combinations thereof. In one example, semiconductor layer 14 includes major surface 18 of region of semiconductor material 11. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, or other similar materials as known to one of ordinary skill in the art.

In some examples, semiconductor layer 14 has a dopant concentration that is less than the dopant concentration of substrate 12. The dopant concentrations and thicknesses of semiconductor layer 14 can be increased or decreased depending, for example, on the desired breakdown ($BV_{DSS}$) rating and layout design of semiconductor device 10. In some examples, semiconductor layer 14 can have a dopant profile that changes over its depth inward from major surface 18. Such changes can include linear and non-linear profiles over the thickness of semiconductor layer 14.

In the present example, shielded-gate trench structures 13 include an active trench 23 extending from major surface 18 of region of semiconductor material 11 inward to a depth within semiconductor layer 14. Shielded-gate trench structures 13 further include a shield electrode 21, a shield dielectric layer 264 separating shield electrode 21 from semiconductor layer 14, gate dielectric 26 over upper surfaces of active trench 23, gate electrodes 28 disposed adjacent to gate dielectric 26, and an inter-pad dielectric (IPD) 27 electrically isolating shield electrode 21 from gate electrodes 28. As will be described later, shielded-gate trench structures 13 can further include additional shield electrode conductors or additional gate electrode conductors, such as one or more metals or silicides.

In some examples, shield dielectric layer 264 comprises a thermal oxide having a thickness in a range from about 800 Angstroms to about 1050 Angstroms. The thickness of shield dielectric layer 264 can be made thicker or thinner depending on the electrical requirements of semiconductor device 10. For example, the thickness can increase for higher voltage devices including a thickness of about 4000 Angstroms. In other examples, shield dielectric layer 264 can comprise more than one dielectric materials, such as oxides, nitrides, other dielectric materials as known to one of ordinary skill in the art, or combinations thereof.

In some examples, gate dielectric 26 can comprise oxides, nitrides, tantalum pentoxide, titanium dioxide, barium strontium titanate, high k dielectric materials, combinations thereof, or other related or equivalent materials known by one of ordinary skill in the art. In some examples, gate dielectric 26 comprises a thermal oxide having a thickness in a range from about 100 Angstroms to about 1000 Angstroms. In some examples, shield electrodes 21 and gate electrodes 28 comprise doped polycrystalline semiconductor material, such as doped polysilicon. In some examples, the polysilicon is doped with an N-type conductivity dopant, such as phosphorous or arsenic. In other examples, the polysilicon can be doped with a P-type conductivity dopant, such as boron.

In some examples, semiconductor device 10 further comprises a body region 31, which in the present example comprises a P-type conductivity, and is disposed adjacent to shielded-gate trench gate structures 13 as generally illustrated in FIG. 1. Body region 31 can be a plurality of individual doped regions, or can be a continuous interconnected doped region. Body regions 31 have a dopant concentration suitable for forming inversion layers that operate as conduction channels or channel regions for semiconductor device 10 when an appropriate bias voltage is applied to gate electrodes 28. Body regions 31 can extend from major surface 18 to a depth, for example, from about 0.7 microns to about 1.0 microns. Body regions 31 can be formed using doping techniques, such as ion implantation and anneal techniques. Body regions 31 can also be referred to base regions or PHV regions.

In some examples, source regions 33 can be formed within, in, or overlying body regions 31 and, in some examples, can extend from major surface 18 to a depth from about 0.2 microns to about 0.4 microns. In some examples, source regions 33 can have N-type conductivity and can be formed using, for example, a phosphorous or arsenic dopant source. Source regions 33 can be formed using doping techniques, such as ion implantation processes and annealing processes. Source regions 33 can also be referred to current conducting regions or current carrying regions.

In some examples, an interlayer dielectric (ILD) structure 41 can be formed overlying major surface 18. In one embodiment, ILD structure 41 comprises one or more dielectric or insulative layers. In some examples, ILD structure 41 comprises an undoped silicon glass (USG) layer having a thickness in a range from about 800 Angstroms to about 1000 Angstroms and a phosphorous doped silicon glass (PSG) layer having a thickness in a range from about 6000 Angstroms to about 8000 Angstroms. The PSG layer can have a phosphorous weight percentage in a range from about 3% to about 5%. ILD structure 41 can be formed using chemical vapor deposition (CVD) or similar techniques. In some examples, ILD structure 41 can be annealed to densify the structure. In some examples, ILD structure 41 can be planarized using, for example, chemical mechanical planarization (CMP) techniques to provide a more uniform surface topography, which improves manufacturability.

In accordance with the present description, semiconductor device 10 further includes conductive regions 43A providing electrical connection to source regions 33 and body regions 31, and conductive regions 43B providing electrical connection to shield electrodes 21. In accordance with the teachings of the present description, conductive regions 43B provide contact to shield electrodes within the active area of semiconductor device 10 thereby reducing the resistance of shield electrodes 21 during device operation. This is an improvement over previous semiconductor devices that only make contact to the shield electrodes at peripheral regions of the semiconductor device and that rely on long connective interconnects or feeds from peripheral regions to the active area, which add resistance and can degrade device performance. In some examples, conductive regions 43B can be used instead of peripheral region shield electrode contacts. In other examples, conductive regions 43B can be used in addition to the peripheral region shield electrode contacts.

Conductive regions 43A can be formed within contact openings 422A or contact vias 422A and are configured to provide electrical contact to source regions 33 and body regions 31 through contact regions 36. Contact regions 36 can also be referred to as body enhancement regions. In some examples, contact regions 36 comprises a P-type conductivity when body regions 31 comprise P-type conductivity. Contact regions 36 can be formed using doping techniques, such as ion implantation processes and annealing processes. Conductive regions 43B can be formed within contact openings 422B or contact vias 422B and are configured to provide electrical contact to shield electrodes 21. As will be described later, conductive regions 43A within contact openings 422A can be further formed to provide electrical connection to gate electrodes 28 at one or more different locations on semiconductor device 10.

In accordance with the present description, conductive regions 43B are electrically isolated from gate electrodes 28 by dielectric 53B, such as dielectric spacers 53B provided along sidewalls of contact openings 422B. In some examples, dielectric spacers 53B comprise oxides, nitrides, organic dielectrics, other insulative materials as known to one of ordinary skill in the art, or combinations thereof. The present configuration is an advantage over prior approaches that used a break or discontinuity in the gate conductor line to completely isolate the gate conductor from the shield contact. The present configuration allows for conductor 28 to be continuous thereby improving gate resistance compared to prior approaches.

Figure 2:
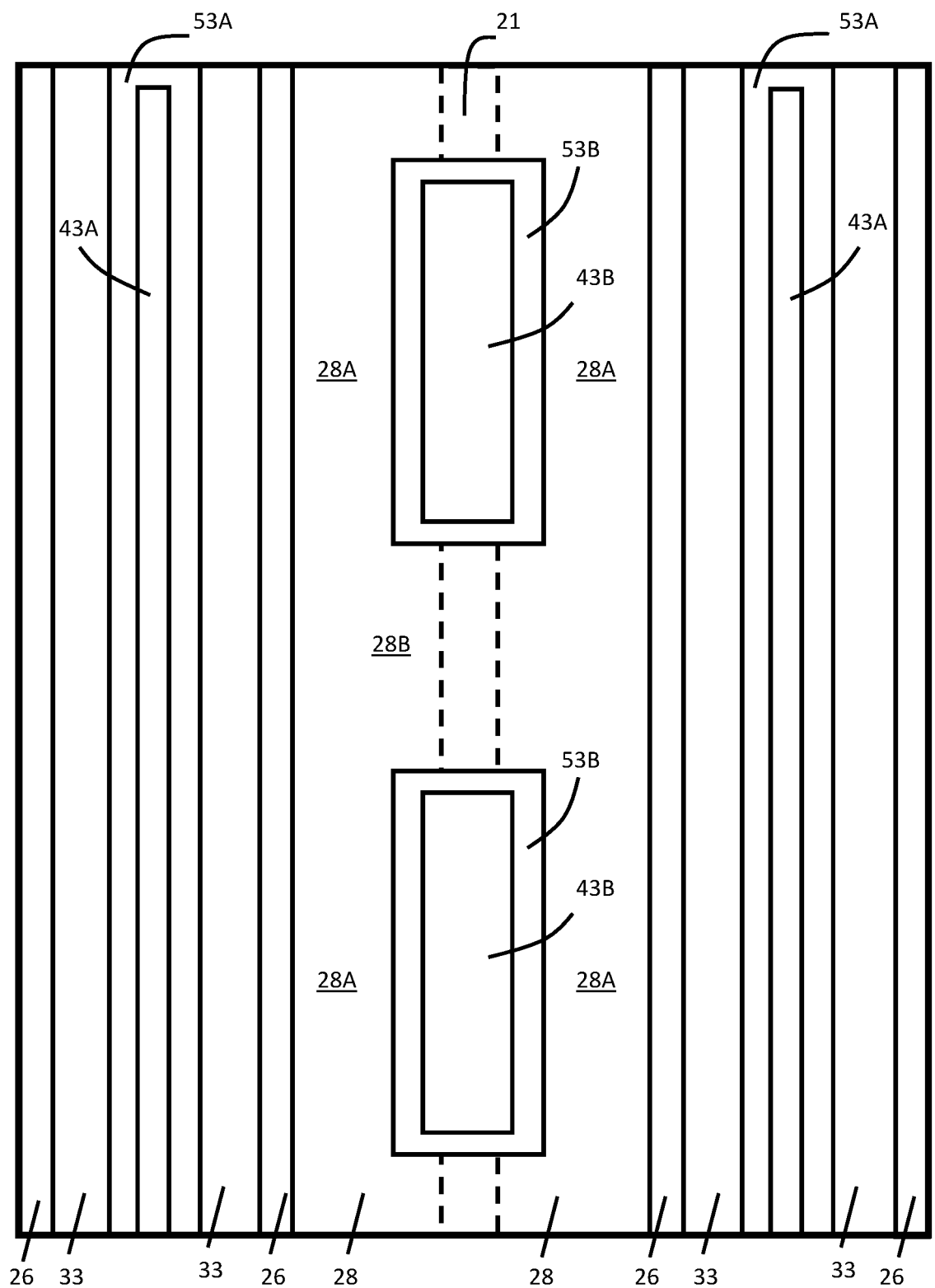
FIG. 2 illustrates a top view of a portion of the semiconductor device of FIG. 1 in accordance with the present description.

FIG. 2 illustrates a top view of a portion of semiconductor device 10 to further describe the present configuration. In FIG. 2, two conductive regions 43B are illustrated, but it is understood that semiconductor device 10 can comprises multiple conductive regions 43B. In some examples, dielectric spacers 53B completely surround or encompass conductive regions 43B. Although conductive regions 43B are illustrated as square shape, it is understood that other shapes, such as circular shapes or shapes with rounded corners can be used. As described above, in some examples, gate conductor 28 comprises a continuous stripe shape, but with the presence of conductive regions 43B, gate conductor 28 includes regions 28A that are narrower than regions 28B as regions 28A accommodate conductive regions 43B. Regions 28A are designed to accommodate critical dimensions for the process flow chosen so that the design rules can accommodate dielectric spacers 53B and conductive regions 43B while maintaining sufficient width for regions 28A. In this way, gate conductors 28 are continuous structures around conductive regions 43B so that gate resistance is not impacted in an undesirable manner More particularly, in some examples, gate electrode 28 comprises a shape that surrounds conductive regions 43B in the top view so that gate electrode 28 is uninterrupted by conductive regions 43B and dielectric spacers 53B.

Another advantage of conductive regions 43B is that these regions can be placed in predetermined locations within the active area of semiconductor device 10, which can be used to tune shield resistance by specific location to meet specific application requirements. In some examples, conductive regions 43B can be uniformly distributed within an active area of semiconductor device 10. In some examples, conductive regions 43B can be non-uniformly distributed within an active area of semiconductor device 10.

In one example, for a 40 volt (V) device, gate dielectric 26 can have a thickness of about 400 Angstroms. The thickness of dielectric spacers 53B can be about twice the thickness of gate dielectric 26 for reliability or about 800 Angstroms. For a 4.5 sigma process, the width of trench 23 can be about 5,250 Angstroms, the width of gate electrode can be about 4,500 Angstroms, and the width of conductive regions 43B can be about 1,200 Angstroms.

In some examples, dielectric spacers 53A can be provided along sidewalls of openings 422A. Dielectric spacers 53A can comprise the same materials as dielectric spacers 53B. In other examples, dielectric spacers 53A can be omitted.

Referring back to FIG. 1, conductive regions 43B extend through gate conductor 28 and through IPD 27 to make physical contact to an upper surface 21A of shield electrodes 21. In some examples, dielectric spacers 53B extend to the same depth or location as conductive regions 43B within region of semiconductor material 11. In other examples, dielectric spacers 53B can extend only partially into IPD 27. More particularly, dielectric spacers 53B extend to depth sufficient to electrically isolate conductive regions 43B from gate conductors 28. In some examples, dielectric spacers 53A can extend to major surface 18 of region of semiconductor material 11 or can terminate proximate to gate dielectric 26.

In some examples, conductive regions 43A and 43B can be conductive plugs or plug structures. In some examples, conductive regions 43A and 43B can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. In some examples, the conductive fill material includes tungsten. In some examples, conductive regions 43A and 43B can be planarized to provide a more uniform surface topography.

A conductive layer 44A can be formed overlying major surface 18, and a conductive layer 46 can be formed overlying major surface 19. Conductive layers 44A and 46 can be configured to provide electrical connection between the individual device components of semiconductor device 10 and a next level of assembly. In some examples, conductive layer 44A can be titanium/titanium-nitride/aluminum-copper or other related or equivalent materials known by one of ordinary skill in the art. Conductive layer 44A is configured as an external source electrode. FIG. 1 illustrates an example where shield electrodes 21 and source regions 33 are electrically connected together through conductive layer 44A to be at the same potential when device semiconductor 10 is in use. In other examples, shield electrodes 21 can be configured to be independently biased.

In some examples, conductive layer 46 can be a solderable metal structure such as titanium-nickel-silver, chromium-nickel-gold, or other related or equivalent materials known by one of ordinary skill in the art and is configured as a drain electrode or terminal. In some examples, a further passivation layer (not shown) can be formed overlying conductive layer 44A. It is further understood that additional conductive layers can be included above conductive layer 44A separated by an additional ILD layer(s).

In accordance with the present example, semiconductor device 10 is an improvement over previous devices because conductive regions 43B reduce shield resistance. This has been found empirically to improve power conversion efficiencies in certain applications, such as buck converter applications as well as other applications. As will be described in more detail later, conductive regions 43B can be added with just one additional masking step and between about four (4) to about seven (7) additional process steps with an estimated cost impact of about $25 dollars per wafer.

Figure 3:
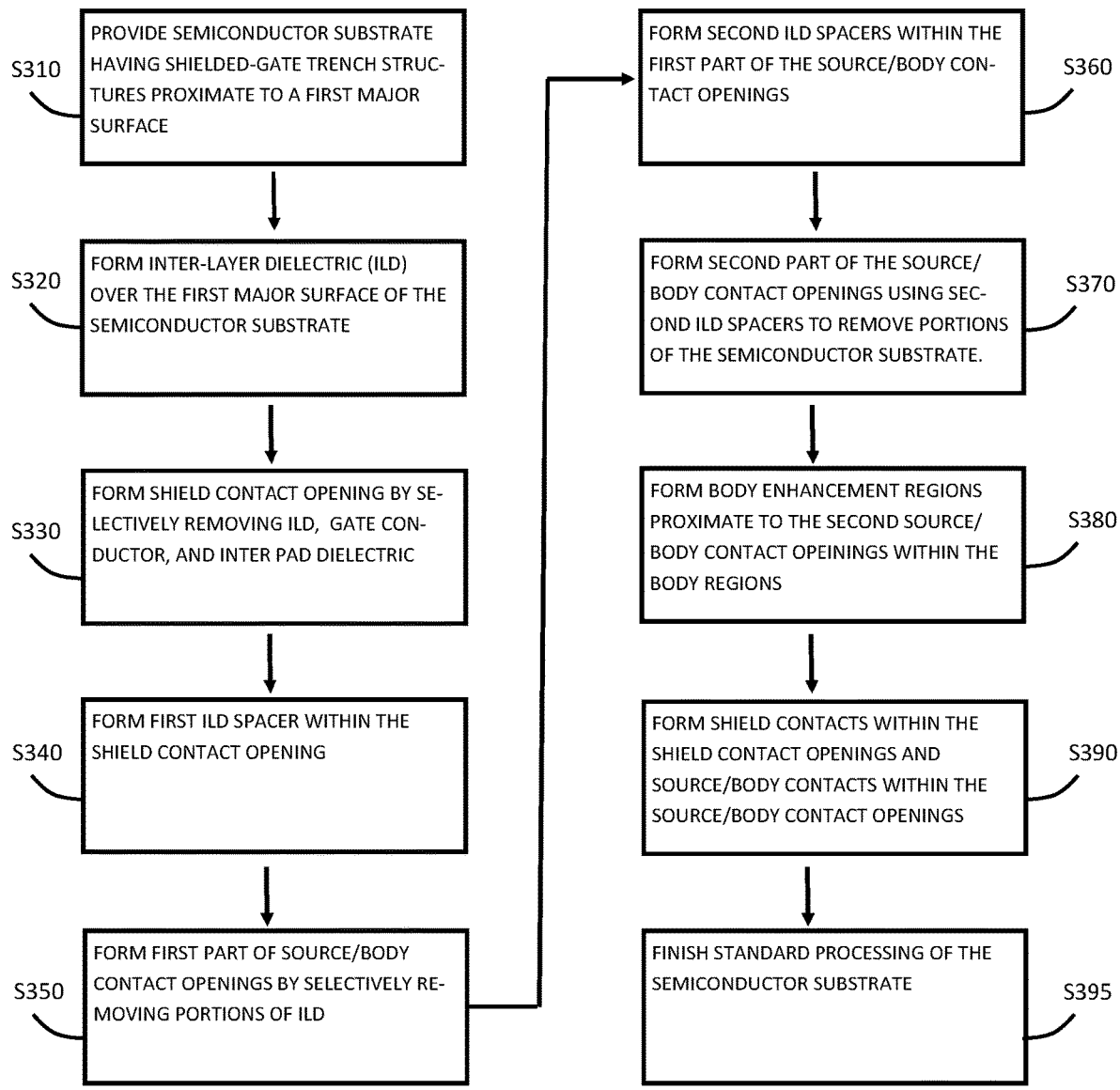
FIG. 3 illustrates a flowchart of a method for providing a semiconductor device in accordance with the present description.

FIG. 3 illustrates a flowchart of a method 300 for providing an electronic device, such as a semiconductor device. In some examples, the semiconductor device of method 300 can be similar to one or more of the semiconductor devices illustrated herein including semiconductor device 10 or variations thereof.

Block S310 of method 300 comprises providing a semiconductor substrate having shielded-gate trench structures. In some examples, the semiconductor substrate can be similar to region of semiconductor material 11, which includes substrate 12 and semiconductor layer 14, and further includes shielded-gate trench structures 13 proximate to major surface 18.

More particularly, in block S310 the semiconductor substrate has been processed through several front-end unit processes, such as dielectric formation, photo-masking, etching, deposition, ion implantation, and anneal unit processes. Such unit processes can be used to form shielded-gate structures 13 (including, for example, shield electrodes 21, shield dielectric 264, IPD 27, gate dielectric 26 and gate electrode 28), body regions 31, and source regions 33 as described in conjunction with FIG. 1.

Block S320 of method 300 comprises forming an inter-layer dielectric (ILD) over the first major surface of the semiconductor substrate. In some examples, the inter-layer dielectric (ILD) can be similar to ILD structure 41 or variations thereof. In some examples, the ILD structure can comprise an undoped silicon glass (USG) layer having a thickness in a range from about 800 Angstroms to about 1000 Angstroms and a PSG layer having a thickness in a range from about 6000 Angstroms to about 8000 Angstroms. The PSG layer can have a phosphorous weight percentage in a range from about 3% to about 5%. The ILD structure can be formed using CVD or similar techniques. In some examples, the ILD structure can be annealed to densify the structure. In some examples, the ILD structure can be planarized using, for example, CMP techniques.

Figure 4:
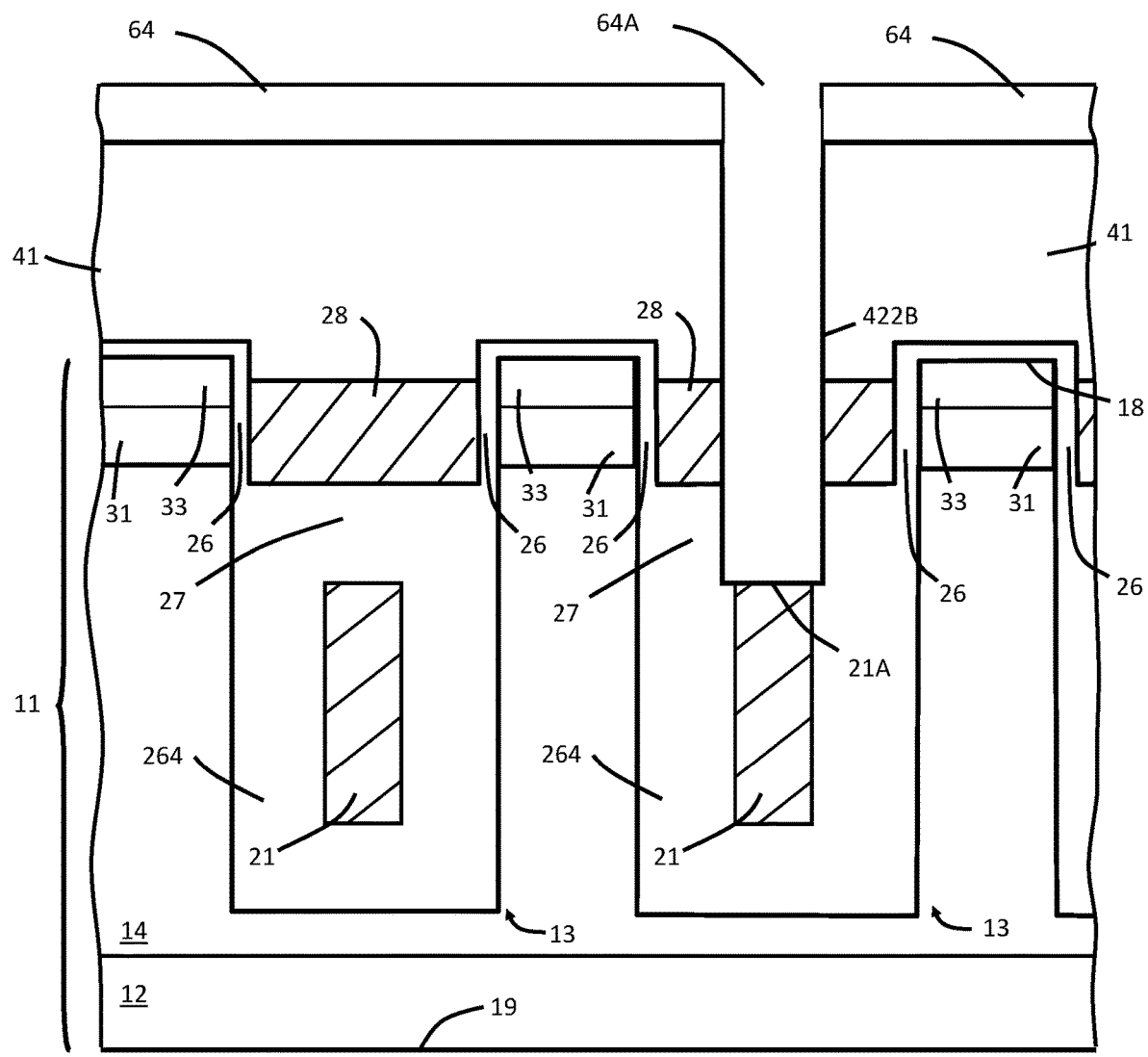
FIGS. 4, 5, 6, 7, 8, 9, and 10 illustrate cross-sectional views of a semiconductor device at various stages of processing in accordance with the method of FIG. 3.

Block S330 of method 300 comprises forming a shield contact opening by selectively removing a portion of the ILD structure, the gate conductor and the inter-pad dielectric (IPD). FIG. 4 illustrates a cross-sectional view of an electronic device, such as semiconductor device 10 after the steps described in blocks S310, S320, and S330. In some examples, a mask 64 is provided over ILD structure 41 with openings 64A where conductive regions 43B will be formed to provide contacts to shield electrodes 21. In some examples, mask 64 comprises a photo-mask and can be formed using photo-resist deposition, exposure, and development processes. Next, portions of ILD structure 41, gate conductor 28, and IPD 27 can be removed to provide contact opening 422B, which, in some examples, can expose upper surface 21A of shield electrode 21. In some examples, dry or wet etching techniques can be used to remove the different materials. In some examples, mask 64 can then be removed after contact opening 422B is provided.

Figure 5:
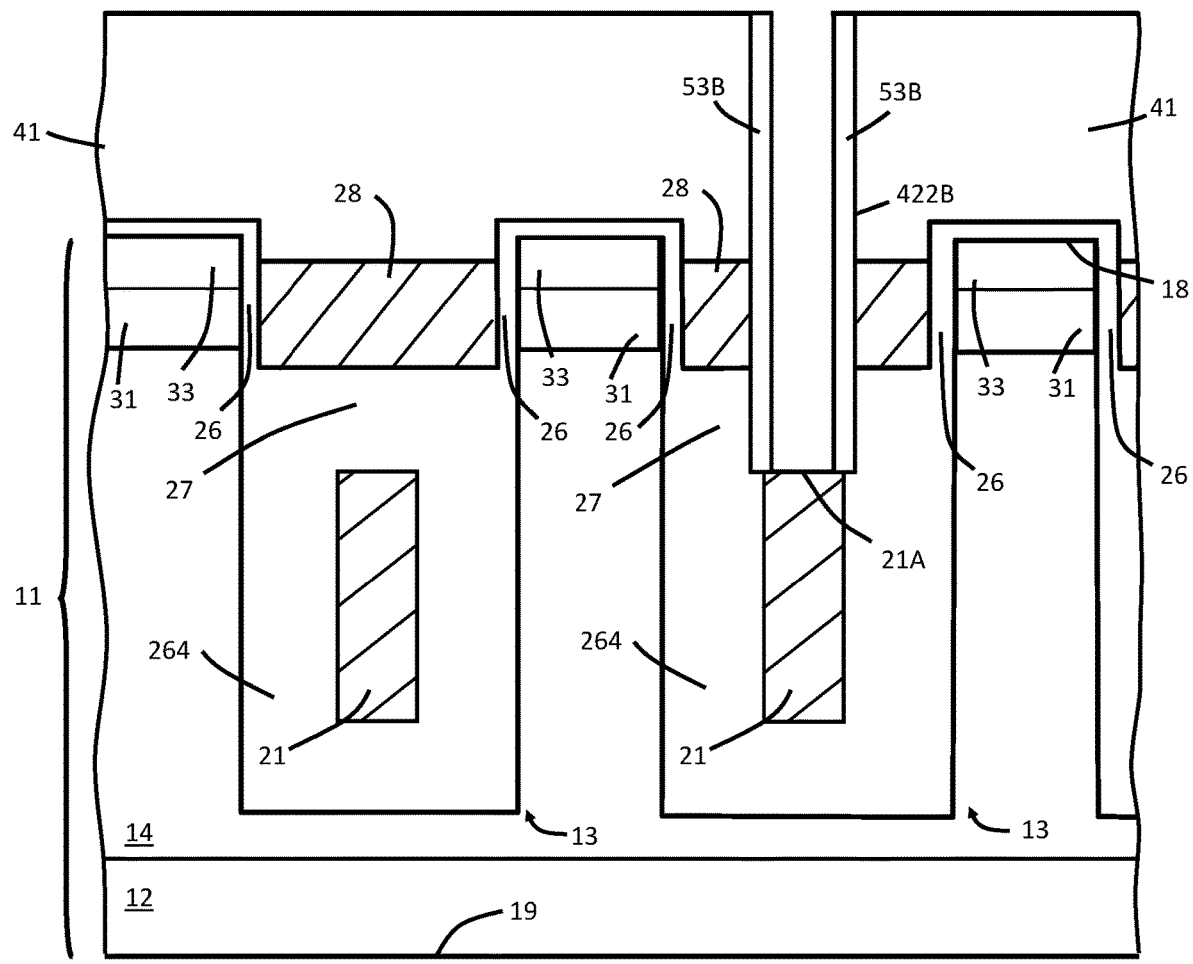

Block S340 of method 300 comprises forming a first ILD spacer within the shield contact opening. In some examples, this can include forming dielectric spacers 53B within contact opening 422B as shown in FIG. 5, which illustrates a cross-sectional view of semiconductor device 10 after further processing. In some examples, a dielectric is formed overlying ILD structure 41 and within contact opening 422B. The dielectric has a thickness so as to not completely fill contact opening 422B. In some examples, the dielectric has a thickness that is about twice the thickness of gate dielectric 26 as described previously. The dielectric can comprise oxides, nitrides, other insulating materials as known to one of ordinary skill in the art, or combinations thereof. The dielectric can be formed using CVD, plasma-enhanced CVD (PECVD), low temperature oxide (LTO) processes, or other processes as known to one of ordinary skill in the art. After the dielectric is formed, an anisotropic etch can be used to remove portions of the dielectric along the upper surface of ILD structure 41 and the upper surface 21A of shield electrode 21. The remaining dielectric provides dielectric spacers 53B as illustrated in FIG. 5.

Figure 6:
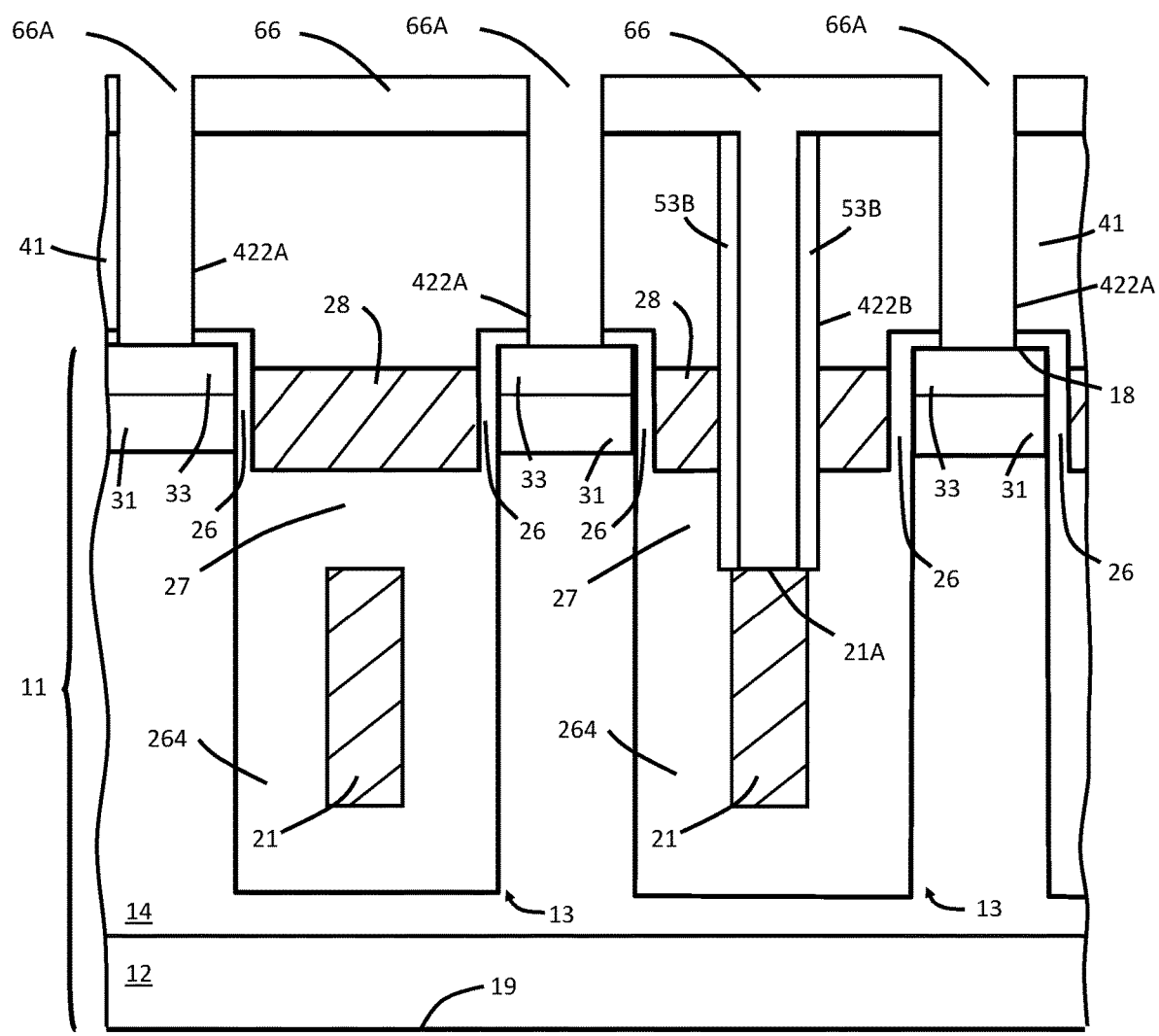

Block S350 of method 300 comprises forming a first part of source/body contact openings by selectively removing portions of the ILD. In some examples, this includes providing a mask 66 over ILD structure 41 having openings 66A as shown in FIG. 6, which illustrates a cross-sectional view of semiconductor device 10 after further processing. In some examples, mask 66 covers contact opening 422B and dielectric spacers 53. Openings 66A correspond to where conductive regions 43A will be formed to provide source/body contacts for semiconductor device 10. In some examples, mask 66 comprises a photo-mask and can be formed using photo-resist deposition, exposure, and development processes. Next, portions of ILD structure 41 can be removed to provide contact openings 422A, which can expose major surface 18 of region of semiconductor material 11. In some examples, this step also removes any portion of gate dielectric 26 that may be present over major surface 18 as illustrated in FIG. 6. In some examples, dry or wet etching techniques can be used to remove ILD structure 41 and gate dielectric 26. In some examples, mask 66 can then be removed after contact openings 422A are provided. It is understood that block S350 can also be used to form gate contact openings in predetermined location(s) to provide for gate contacts to gate conductor 28.

Figure 7:
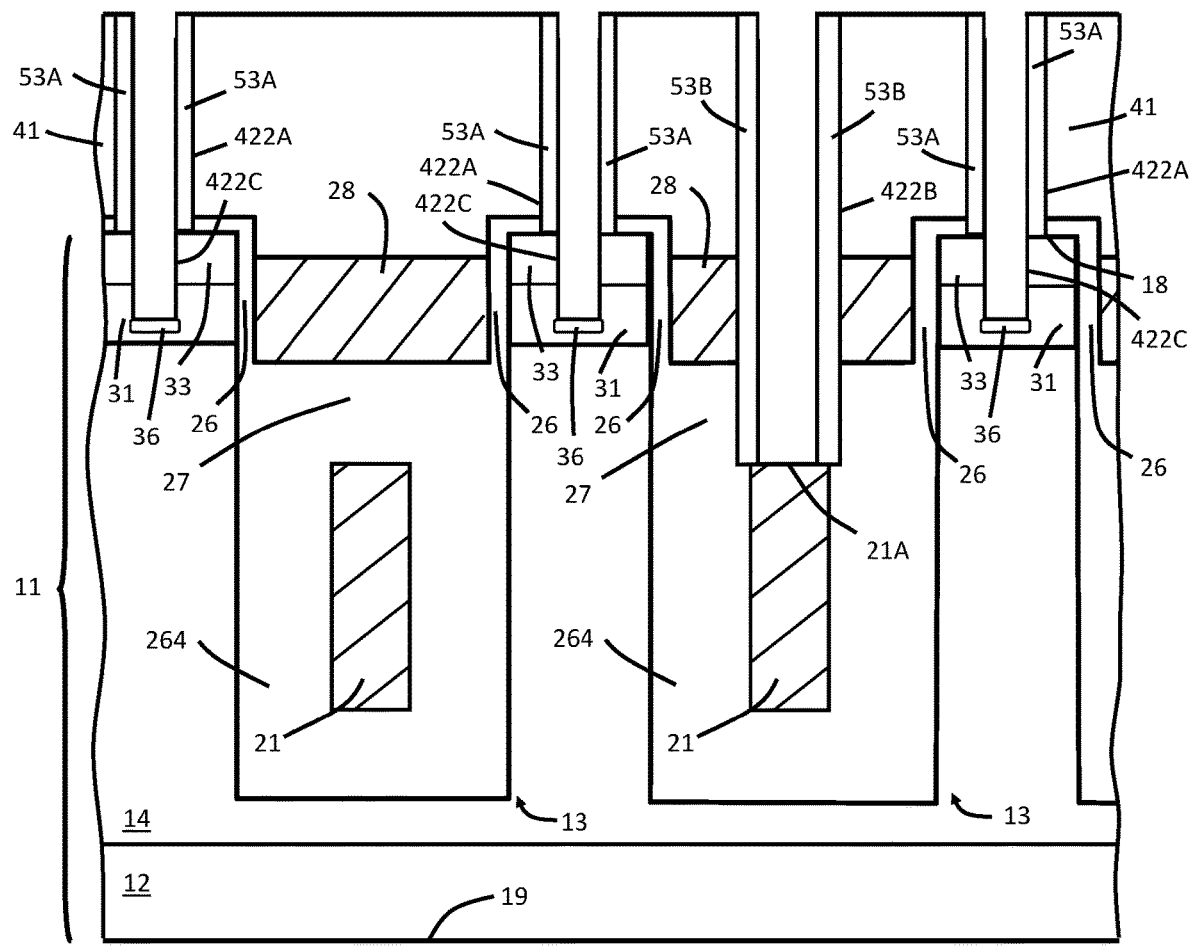

Block S360 of method 300 comprises forming second ILD spacers within the first part of the source/body contact openings. In some examples, the second ILD spacers can be similar to dielectric spacers 53A formed with contact openings 422A as shown in FIG. 7, which is a cross-sectional view of semiconductor device 10 after further processing. In some examples, a dielectric is formed overlying ILD structure 41 and within contact openings 422A. The dielectric has a thickness so as to not completely fill contact openings 422A. The dielectric can comprise oxides, nitrides, other insulating materials as known to one of ordinary skill in the art, or combinations thereof. The dielectric can be formed using CVD, PECVD, LTO processes, or other processes as known to one of ordinary skill in the art. After the dielectric is formed, an anisotropic etch can be used to remove portions of the dielectric along the upper surface of ILD structure 41 and the exposed portions of major surface 18. The remaining dielectric provides dielectric spacers 53A as illustrated in FIG. 7.

Block S370 of method 300 comprises forming a second part of the source/body contact openings using the second ILD spacers to remove portions of the semiconductor substrate. In some examples, the second part of the source/body contacts can be contact openings 422C as shown in FIG. 7.

In some examples, a fluorine based chemistry can be used to remove potions of region of semiconductor material 11 to provide contact openings 422C extending inward from major surface 18 aligned to dielectric spacers 53A. That is, contact openings 422C are formed using dielectric spacers 53A as a mask. In some examples, contact openings 422C extend past source regions 33 and terminate with body regions 31 of semiconductor device 10.

Block S380 of method 300 comprises forming body enhancement regions proximate to the source/body contact openings within the body regions of the semiconductor substrate. In some examples, ion implantation and anneal processes can be used to form contact regions 36 within body regions 31 as illustrated in FIG. 7. Contact regions 36 are configured to enhance the contact characteristics between body regions 31 and conductive regions 43A formed subsequently.

Figure 8:
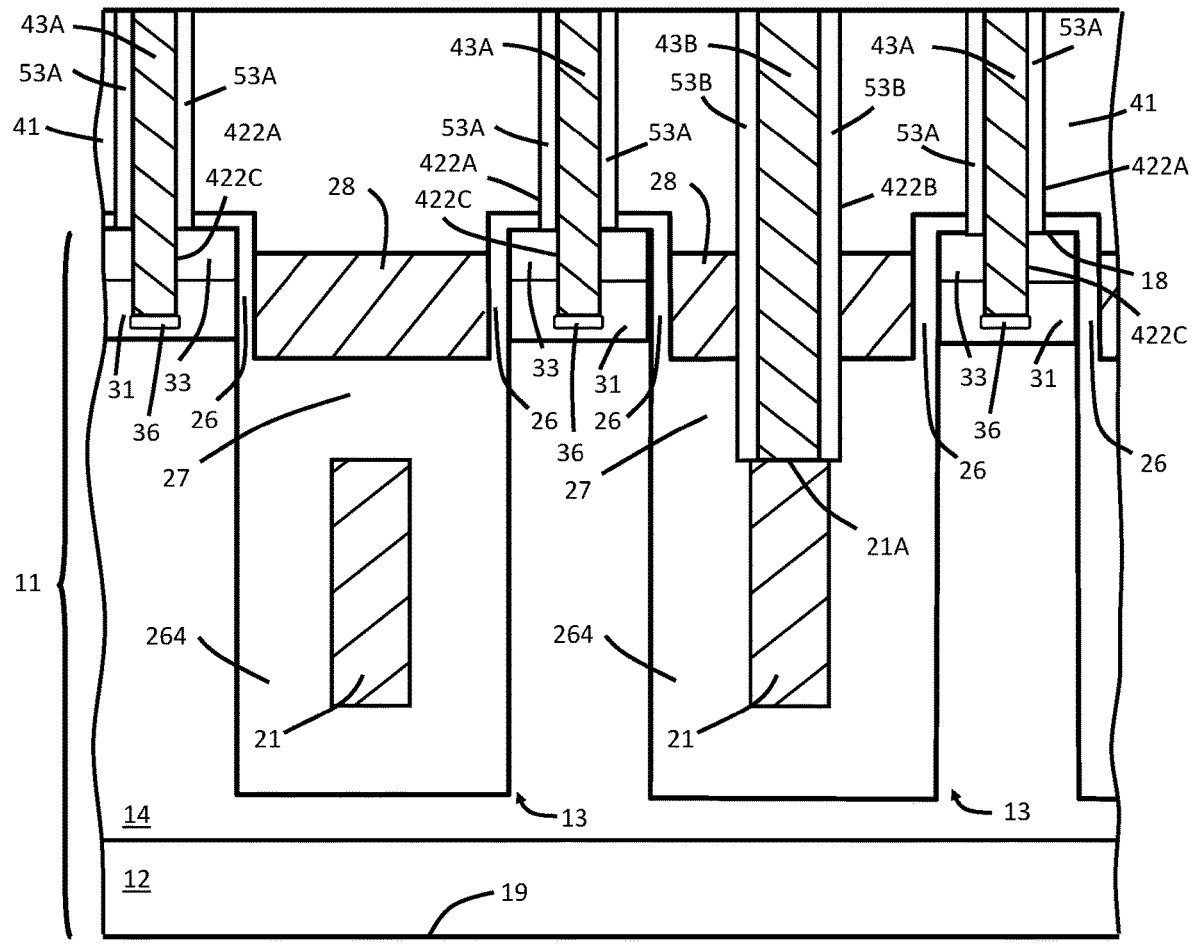

Block S390 of method 300 comprises forming shield contacts within the shield contact openings and source/body contacts within the source/body contact regions. In some examples, this can include forming conductive regions 43B within contact openings 422B, and forming conductive regions 43A within contact openings 422A and 422C as shown in FIG. 8, which is a cross-sectional view of semiconductor device 10 after further processing. In some examples, conductive regions 43A and conductive regions 43B can be conductive plugs or plug structures. In some examples, conductive regions 43A and 43B can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. Conductive regions 43A and 43B can be formed using evaporation, sputtering, CVD, or other processes as known to one ordinary skill in the art. In some examples, the conductive fill material includes tungsten. In some examples, conductive regions 43A and 43B can be planarized using CMP processing to provide a more uniform surface topography.

Block S395 of method 300 comprises finishing processing of the semiconductor substrate. In some examples, this can include forming conductive layer 44A, reducing the thickness of region of semiconductor material 11 using, for example, grinding and etching processes, and forming conductive layer 46 to provide semiconductor device 10 as illustrated in FIG. 1. This further included adding passivation layers, singulating region of semiconductor material 11 into individual semiconductor devices, and assembling the individual semiconductor device into protective packaging.

Figure 9:
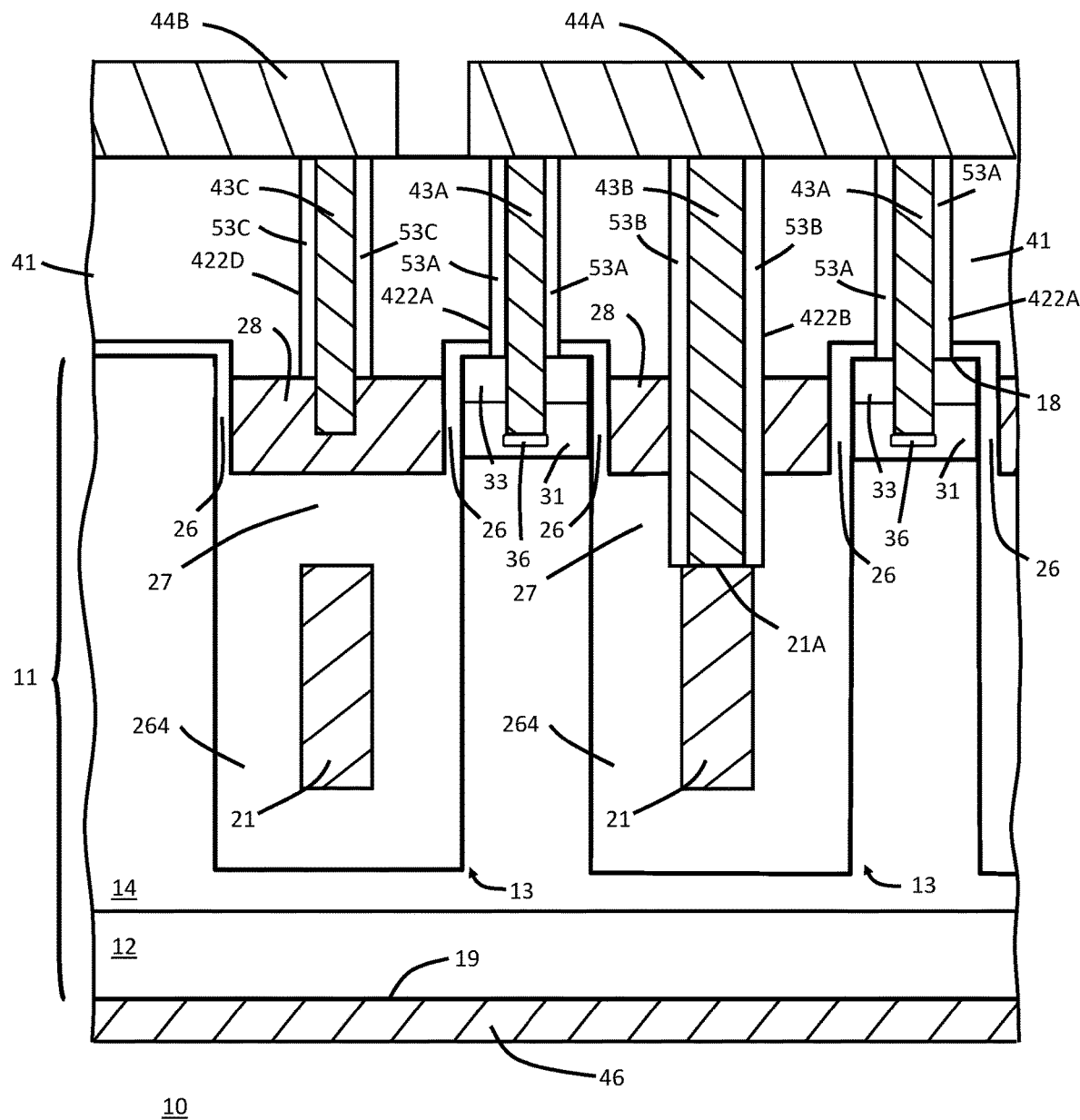

FIG. 9 illustrates a cross-sectional view of semiconductor device 10 at a different location within semiconductor device 10. More particularly, FIG. 9 illustrates a portion of semiconductor device 10 where contact is made to gate conductor 28. In some examples, a contact opening 422D is provided through ILD structure 41, which extends to gate conductor 28. In some examples, dielectric spacers 53C can be provided along sidewall surfaces of contact opening 422D. In some examples, contact opening 422D and dielectric spacers 53C can be formed at the same time as contact openings 422A and dielectric spacers 53C. In some examples, conductive region 43C is provided within contact opening 422D, can comprise the same materials as conductive regions 43A and 43B, and can be formed at the same time as conductive regions 43A and 43B. In some examples, contact opening 422D and conductive regions 43C can be provided proximate to a peripheral edge portion of semiconductor device 10. In some examples, a portion of gate conductor 28 can be etch so that conductive region 43C is partially embedded within gate conductor 28 as generally illustrated in FIG. 9. The portion of gate conductor 28 can be removed, for example, when contact openings 422C are formed as described previously. As illustrated in FIG. 9, in some examples dielectric spacers 53C extend only to the upper surface of gate conductor 28. In addition, FIG. 9 illustrates another conductive layer 44B that can be formed at the same time as conductive layer 44A and provides a contact to gate conductor 28 through conductive region 43C. Conductive layer 44B can comprise the same material(s) as conductive layer 44A and can be patterned using photo-masking and etching processes.

Figure 10:
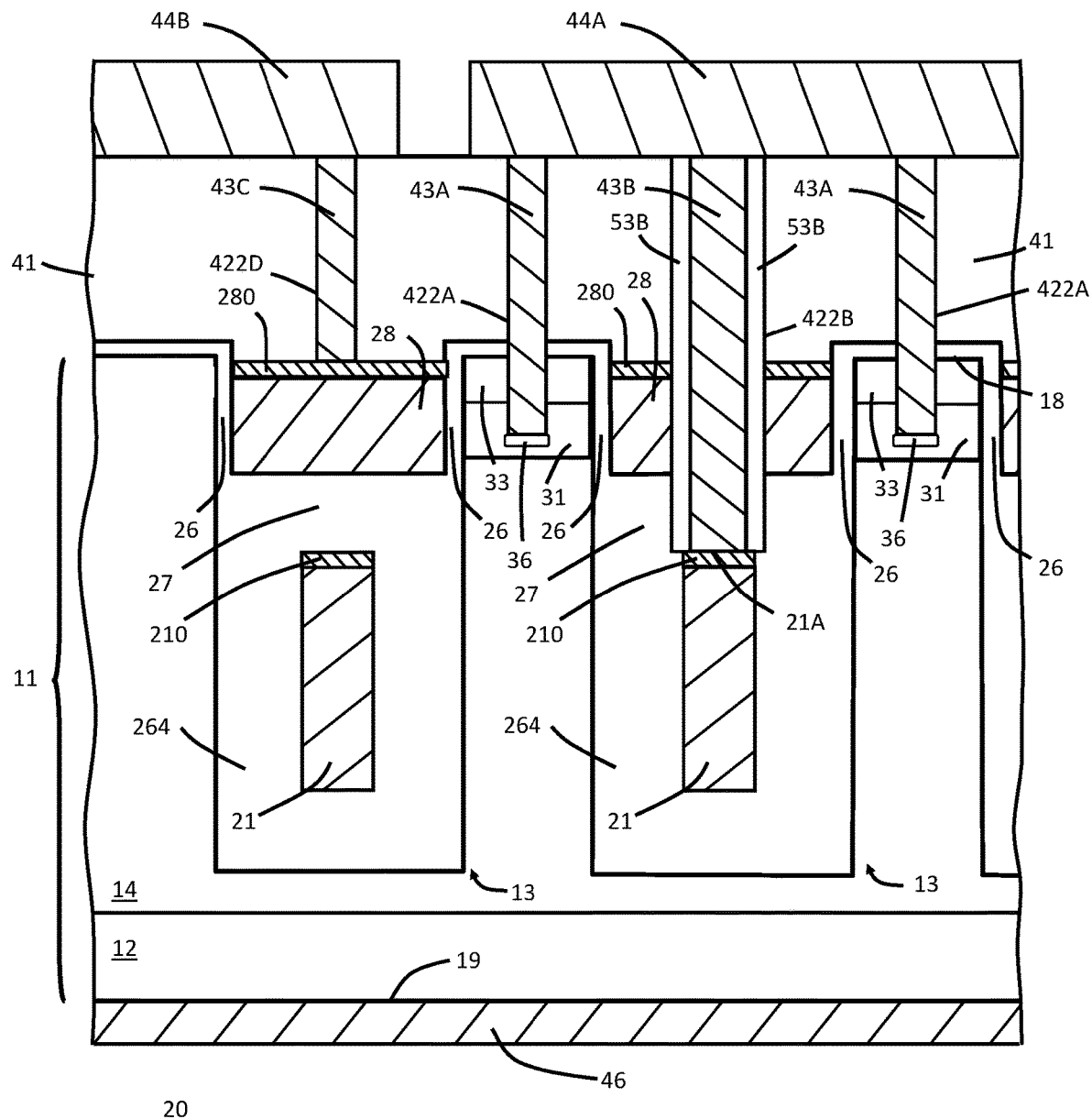

FIG. 10 illustrates an enlarged partial cross-sectional view of an electronic device 20, a semiconductor device 20, or a shielded-gate trench MOSFET 20 having shielded-gate trench structures 13 in accordance with the present description. Semiconductor device 20 is similar to semiconductor device 10 and only differences will be described hereinafter. In semiconductor device 20, dielectric spacers 53B and dielectric spacers 53C can be omitted with electrical isolation provided by ILD structure 41. For example, in method 300 described previously, block S360 can be omitted, and blocks S350 and S370 can be combined to provide contact openings 422A extending all of the way to body regions 31, and to provide contact opening 422D, which can terminate on gate conductive layer 280 (described hereinafter).

In addition, semiconductor device 20 further comprises shield conductive layers 210 over shield electrodes 21 and gate conductive layers 280 over gate conductors 28. Shield conductive layers 210 and gate conductive layers 280 are provided to reduce the resistance of shield electrode 21 and gate electrodes 28. In some examples, shield conductive layers 210 and gate conductive layers 280 can comprise the same materials, such as one or more metals, metal-nitrides, silicides, or other conductive material(s) as known to one of ordinary skill in the art. In this regard, the resistances of gate electrodes 28 and shield electrode 21 can be more closely matched. In some examples, shield conductive layer 210 and gate conductive layers 280 comprise tungsten (W) silicide, cobalt (Co) silicide, titanium (Ti) silicide, or other silicides as known to one of ordinary skill in the art. In some examples, shield conductive layers 210 and gate conductive layers 280 comprise titanium-nitride (TiN). In other examples, shield conductive layers 210 and gate conductive layers 280 comprise a combination of polycrystalline semiconductor material (e.g., polysilicon) and a metal or metal-nitride.

When contact opening 422B is formed in semiconductor device 20, a wet etch can be used to remove a portion of gate conductive layer 280 before etching contact opening 422B through gate conductor 28. In other examples, a blocking mask can be used so the gate conductive layer 280 is not formed where contact openings 422BA will be formed later. It is understood that shield conductive layers 210 and gate conductive layers 280 can be used within of the examples described herein including variations thereof.

Semiconductor devices 10 and 20 are examples where conductive region 43B extends to a first depth through ILD structure 41, gate electrode 28, and IPD 27, and dielectric spacers 53B extend to the first depth.

Figure 11:
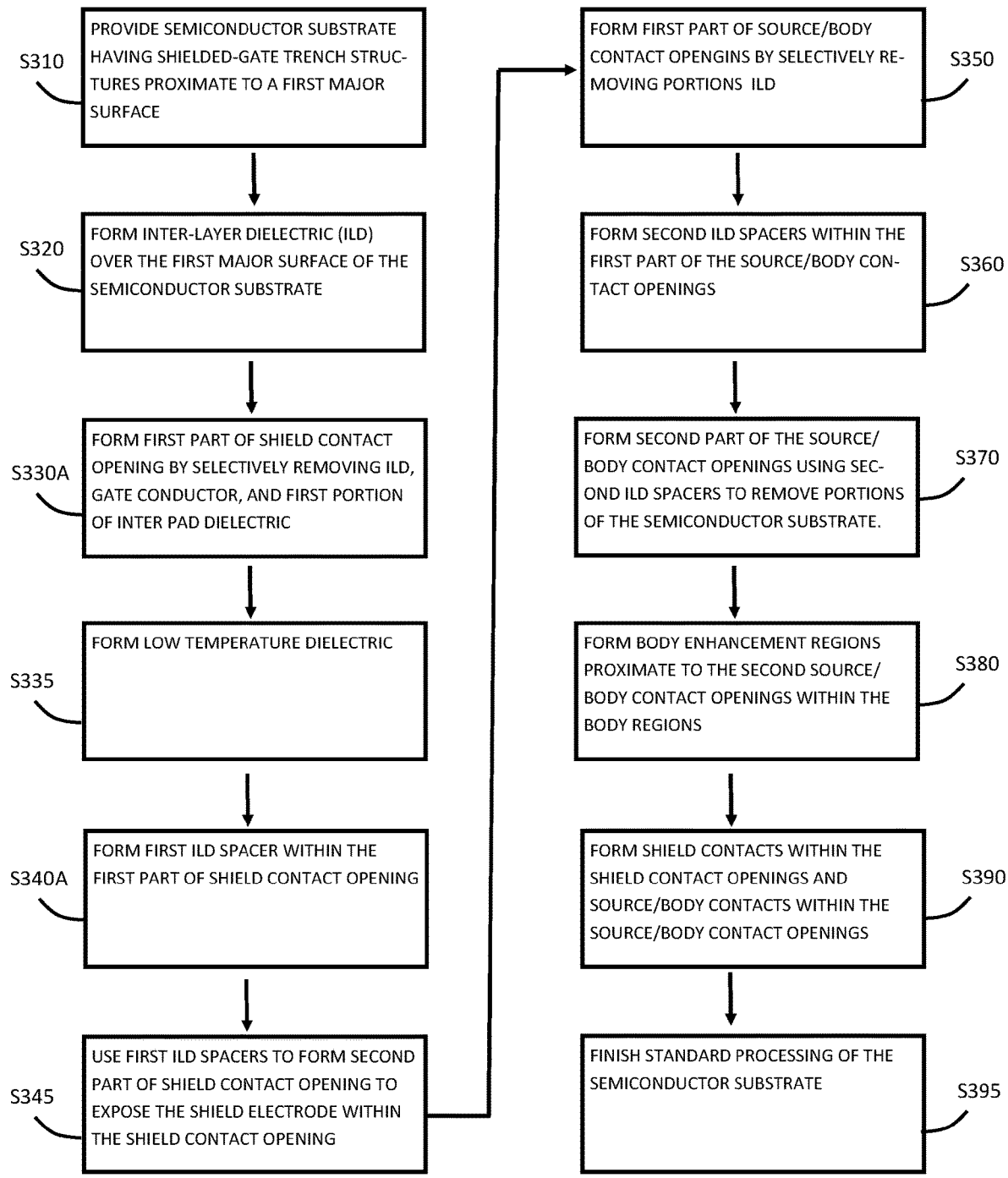
FIG. 11 illustrates a flowchart of a method for providing a semiconductor device in accordance with the present description.

FIG. 11 illustrates a flowchart of a method 300A for providing an electronic device, such as a semiconductor device. In some examples, method 300A can be an alternative method to method 300 for manufacturing semiconductor device 10, which will be described as semiconductor device 30 in FIGS. 12-16 hereinafter.

Blocks S310 and S320 of method 300A are similar to Blocks S310 and S320 of method 300 and the details of the steps will not be repeated again here.

Figure 12:
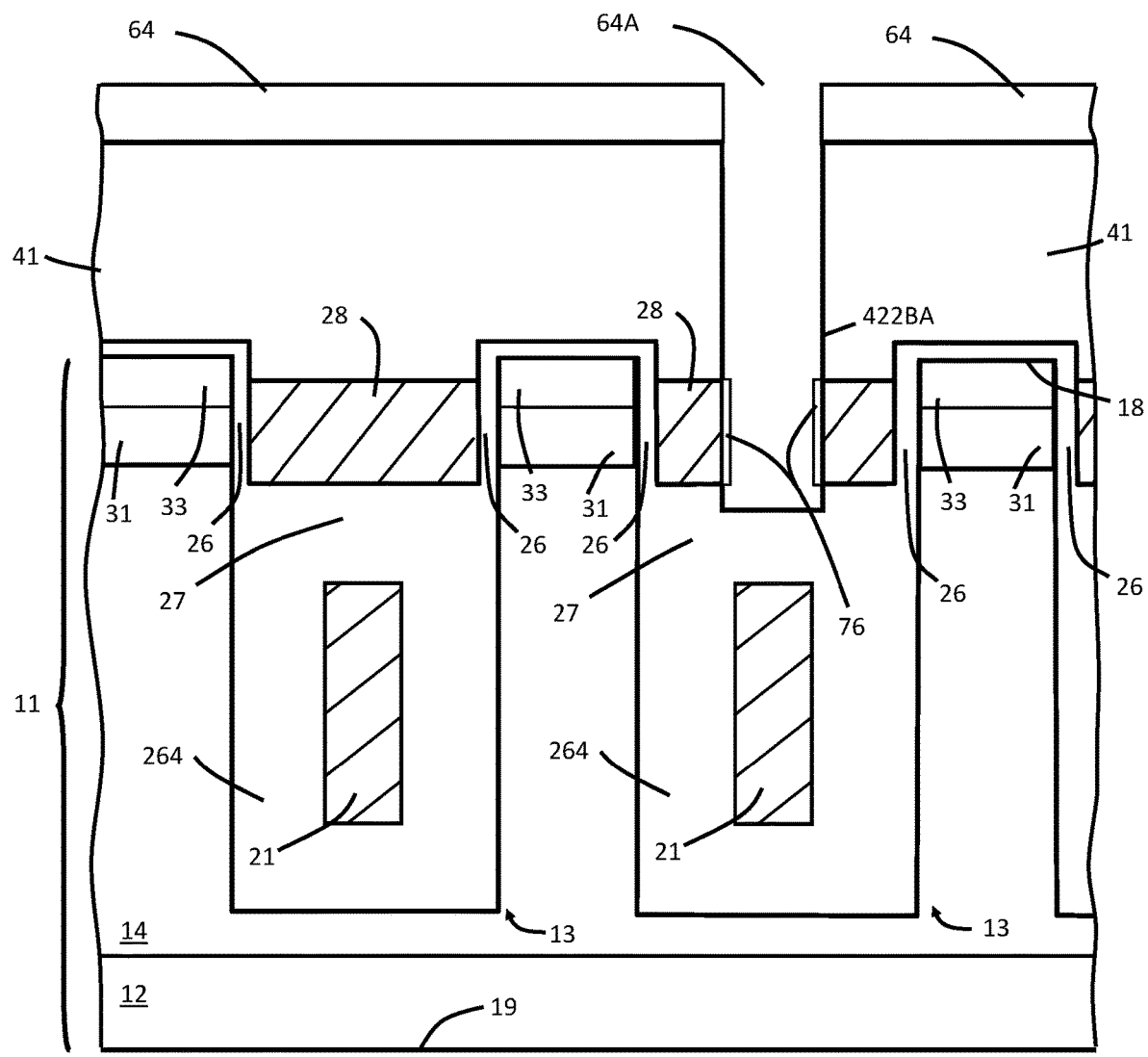
FIGS. 12, 13, 14, 15, and 16 illustrate cross-sectional views of a semiconductor device at various stages of processing in accordance with the method of FIG. 11.

Block S330A of method 300A comprises forming a first part of the shield contact opening by selectively removing portions of the ILD, gate conductor, and a first portion of the inter-pad dielectric (IPD). FIG. 12 illustrates a cross-sectional view semiconductor device 30 after contact opening 422BA has been formed through ILD structure 41, gate conductor 28, and a first portion of IPD 27. In some examples, mask 64 is provided over ILD structure 41 with openings 64A where conductive regions 43B will be formed to provide shield contacts to shield electrodes 21. In some examples, mask 64 comprises a photo-mask and can be formed using photo-resist deposition, exposure, and development processes. Next, portions of ILD 41, gate conductor 28, and a first portion of IPD 27 can be removed to provide contact opening 422BA. In some examples, mask 64 can then be removed after contact opening 422BA is provided.

Block S335 of method 300A comprises forming a low temperature dielectric. In some examples, a low temperature oxidation can be used to provide dielectric 76 at least along exposed portions of gate conductor 28 within contact opening 422BA as illustrated in FIG. 12. In some examples, dielectric 76 can have a thickness in a range from about 100 Angstroms to about 200 Angstroms. It is understood that mask 64 can be removed before forming dielectric 76 in FIG. 12.

Figure 13:
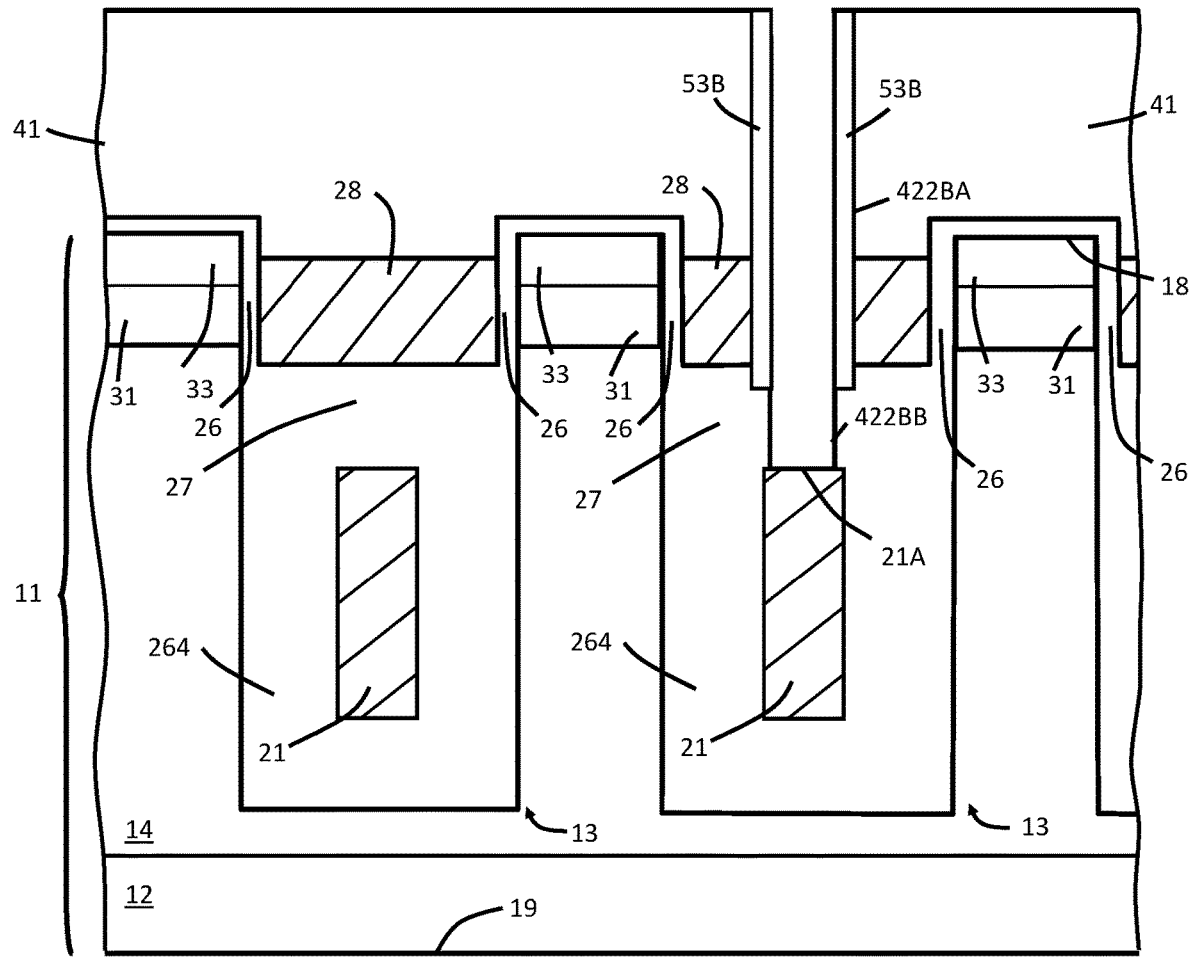

Block S340A of method 300A comprises forming a first ILD spacer within the first part of the shield contact opening. In some examples, this can include forming dielectric spacers 53B within contact opening 422BA as shown in FIG. 13, which illustrates a cross-sectional view of semiconductor device 30 after further processing. In some examples, a dielectric is formed overlying ILD structure 41 and within contact opening 422BA. The dielectric has a thickness so as to not completely fill contact opening 422BA. In some examples, the dielectric has a thickness that is about twice the thickness of gate dielectric 26 as described previously. The dielectric can comprise oxides, nitrides, other insulating materials as known to one of ordinary skill in the art, or combinations thereof. The dielectric can be formed using CVD, PECVD, LTO processes, or other processes as known to one of ordinary skill in the art. After the dielectric is formed, an anisotropic etch can be used to remove portions of the dielectric along the upper surface of ILD structure 41 and a surface of IPD 27. The remaining dielectric provides dielectric spacers 53B as illustrated in FIG. 13.

Block S345 of method 300A comprises using the first ILD spacers to form a second part of the shield contact opening to expose an upper surface of the shield electrode within the shield contact opening. In some examples, this can include using dielectric spacers 53B to remove a second portion of IPD 27 to provide contact opening 422BB and to expose upper surface 21A of shield electrode 12 as illustrated in FIG. 13. It is understood that in this example, the material for dielectric spacers 53B is different than IPD 27 so as to provide etch selectivity between the materials. In some examples, a fluorine based chemistry can be used to remove the second portion of IPD 27. In this example, dielectric spacers 53B do no extend the entire of the shield contact opening provided by contact openings 422BA and 422BB. Contact openings 422BA and 422BB can be an example of contact openings 422B being formed in multiple steps.

Figure 14:
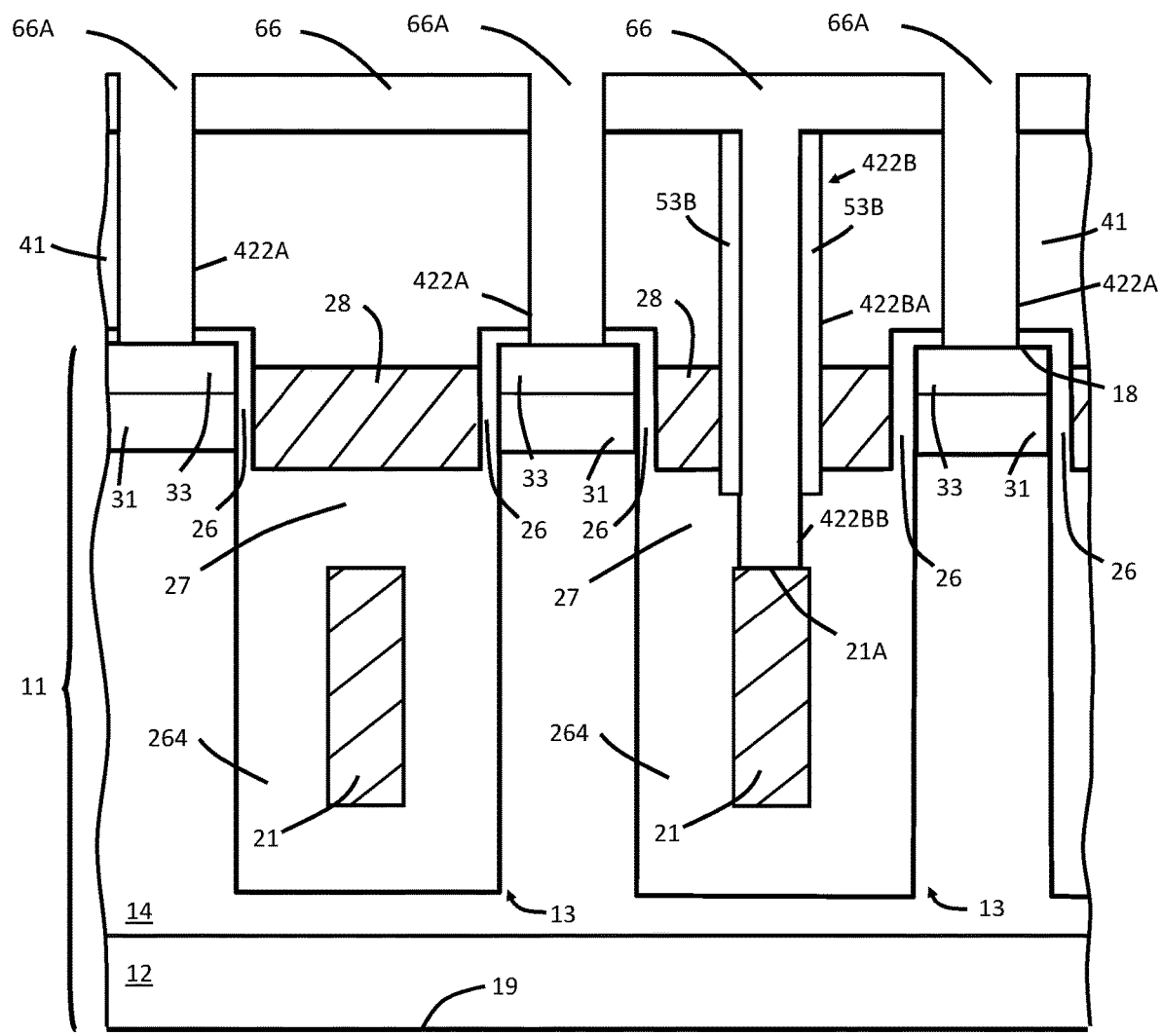

Block S350 of method 300A is similar Block S350 of method 300 described previously, and comprises forming a first part of source/body contact openings by selectively removing portions of the ILD. In some examples, this includes providing a mask 66 over ILD structure 41 having openings 66A as shown in FIG. 14, which illustrates a cross-sectional view of semiconductor device 30 after further processing. In some examples, mask 66 covers contact openings 422BA and 422BB and dielectric spacers 53B. Openings 66A correspond to where conductive regions 43A will be formed to provide source/body contacts for semiconductor device 30. In some examples, mask 66 comprises a photo-mask and can be formed using photo-resist deposition, exposure, and development processes. Next, portions of ILD 41 can be removed to provide contact openings 422A, which can expose major surface 18 of region of semiconductor material 11. In some examples, this step also removes any portion of gate dielectric 26 that may be present over major surface 18 as illustrated in FIG. 14. It is understood that block S350 can also be used to form gate contact openings in predetermined location(s) to provide for gate contacts to gate conductor 28.

Figure 15:
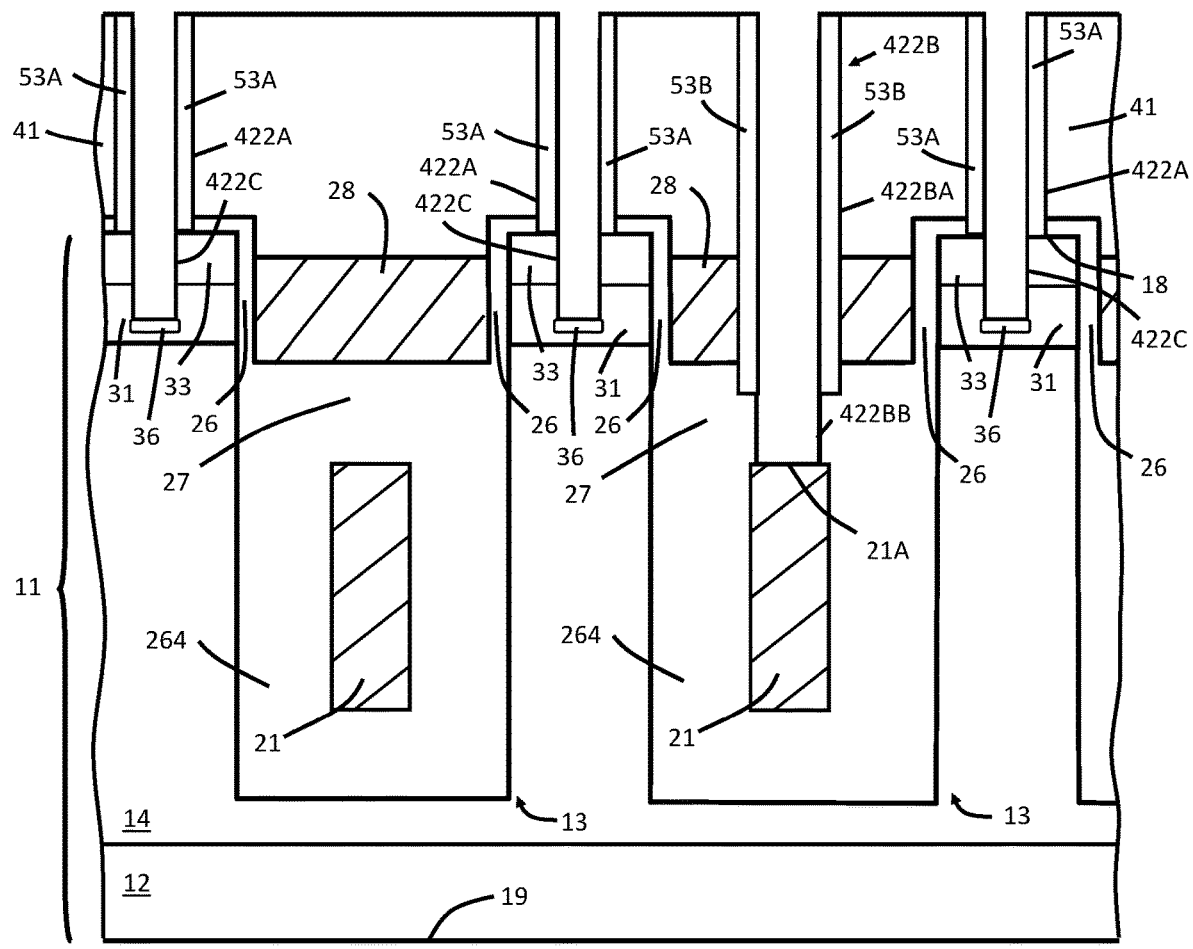

Block S360 of method 300A is similar to Block S360 of method 300 described previously, and comprises forming second ILD spacers with the first of the source/body contact openings. In some examples, the second ILD spacers can be similar to dielectric spacers 53A formed with contact openings 422A as shown in FIG. 15, which is a cross-sectional view of semiconductor device 30 after further processing. In some examples, a dielectric is formed overlying ILD structure 41 and within contact openings 422A. The dielectric has a thickness so as to not completely fill contact openings 422A. The dielectric can comprise oxides, nitrides, other insulating materials as known to one of ordinary skill in the art, or combinations thereof. The dielectric can be formed using CVD, PECVD, LTO processes, or other processes as known to one of ordinary skill in the art. After the dielectric is formed, an anisotropic etch can be used to remove portions of the dielectric along the upper surface of ILD structure 41 and the exposed portions of major surface 18. The remaining dielectric provides dielectric spacers 53A as illustrated in FIG. 15.

Block S370 of method 300A is similar to Block S370 of method 300 and comprises forming a second part of the source/body contact openings using the second ILD spacers to remove portions of the semiconductor substrate. In some examples, the second part of the source/body contacts can be contact openings 422C as shown in FIG. 15. In some examples, a fluorine based chemistry can be used to remove potions of region of semiconductor material 11 to provide contact openings 422C extending inward from major surface 18 aligned to dielectric spacers 53A. That is, contact openings 422C are formed using dielectric spacers 53A as a mask. In some examples, contact openings 422C extend past source regions 33 and terminate within body regions 31 of semiconductor device 30.

Block S380 of method 300A is similar to Block S380 of method 300 and comprises forming body enhancement regions proximate to the second source/body contact openings within the body regions of the semiconductor substrate. In some examples, ion implantation and anneal processes can be used to form contact regions 36 within body regions 31 as illustrated in FIG. 15. Contact regions 36 have a P-type conductivity when body regions 31 comprise P-type conductivity. Contact regions 36 are configured to enhance the contact characteristics between body regions 31 and conductive regions 43A formed subsequently.

Figure 16:
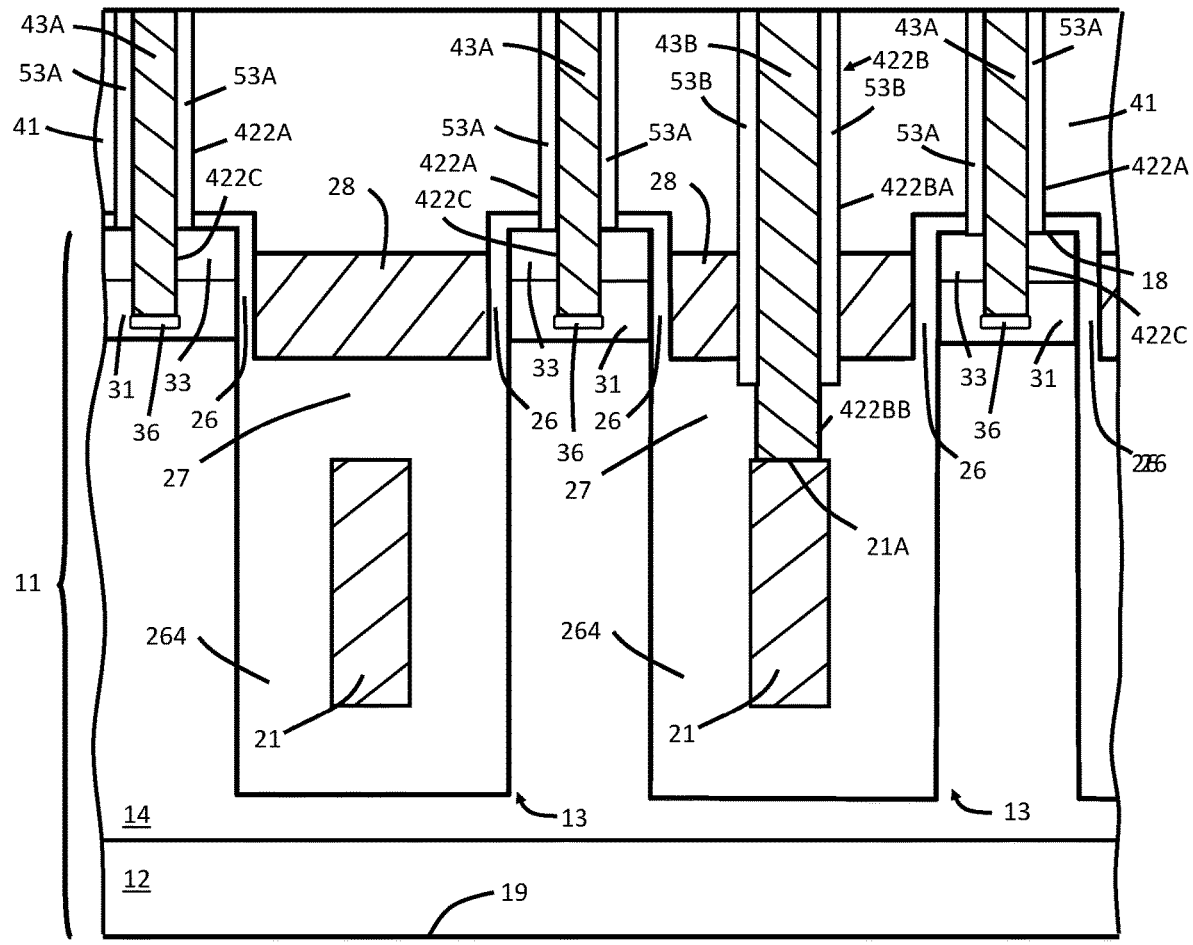

Block S390 of method 300A is similar to Block S390 of method 300 and comprises forming shield contacts within the shield contact openings and source/body contacts within the source/body contact regions. In some examples, this can include conductive regions 43B within contact openings 422BA and 422BB, and conductive regions 43A within contact openings 422A and 422C as shown in FIG. 16, which is a cross-sectional view of semiconductor device 30 after further processing. In some examples, conductive regions 43A and conductive regions 43B can be conductive plugs or plug structures. In some examples, conductive regions 43A and 43B can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. Conductive regions 43A and 43B can be formed using evaporation, sputtering, CVD, or other processes as known to one ordinary skill in the art. In some examples, the conductive fill material includes tungsten. In some examples, conductive regions 43A and 43B can be planarized using CMP processing to provide a more uniform surface topography.

Block S395 of method 300A is similar to Block S395 of method 300 and the details will not be repeated here. It is understood that additional processing of Block S395 of method 300A can be used to provide, among other things, conductive layer 44A and conductive layer 46 as illustrated in FIG. 1 and conductive layer 44B as illustrated in FIG. 9. In accordance with the present description, semiconductor device 30 is an example where conducive region 43B extends to a first depth through ILD structure 41, gate electrode 28, and IPD 27 and where dielectric spacers 53B extend to a second depth through ILD structure 41, gate electrode 28, and IPD 27 that is less than the first depth.

Figure 17:
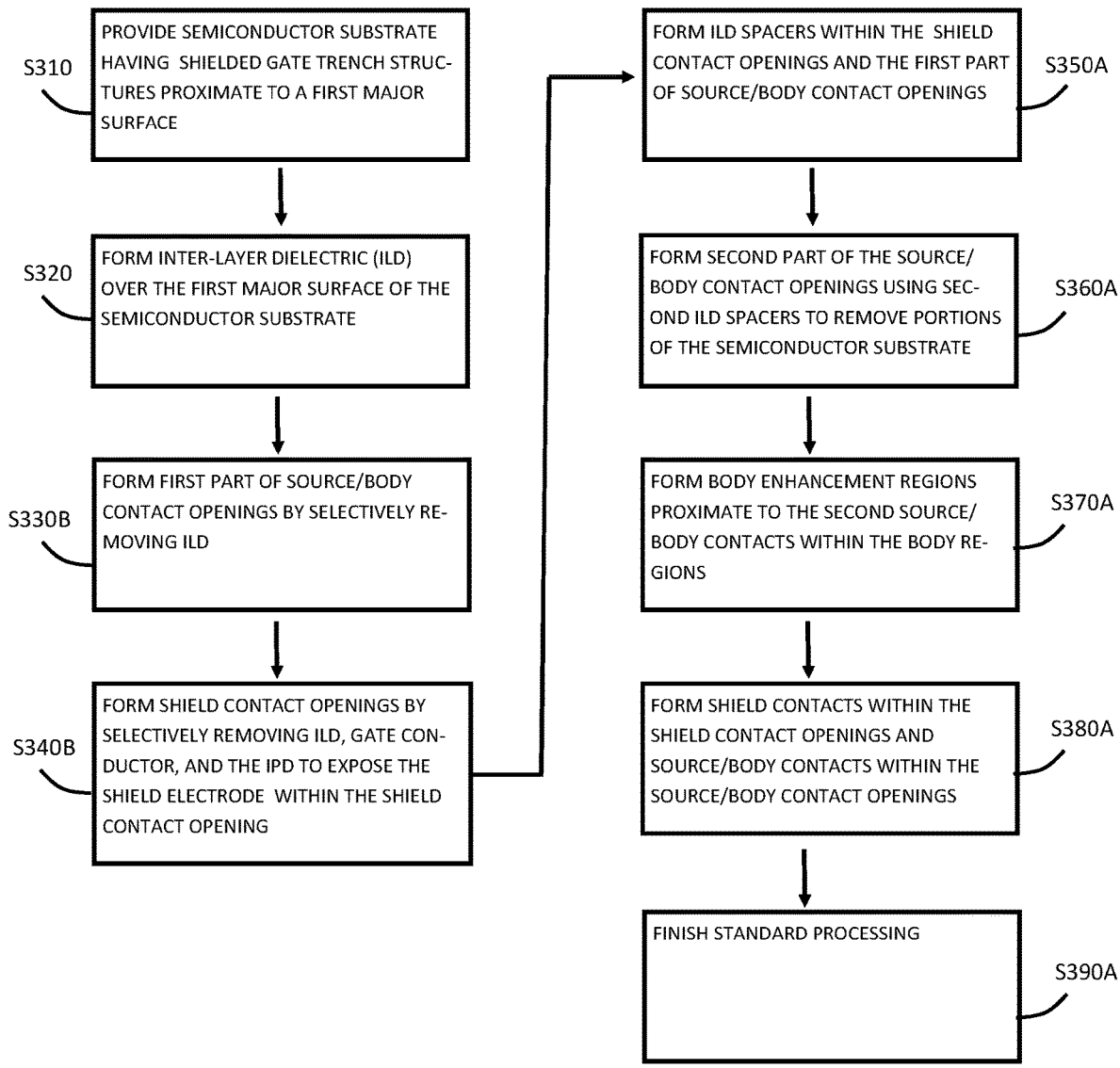
FIG. 17 illustrates a flowchart of a method for providing a semiconductor device in accordance with the present description.

FIG. 17 illustrates a flowchart of a method 300B for providing an electronic device, such as a semiconductor device. In some examples, method 300B can be an alternative method to method 300 for manufacturing semiconductor device 10, which will be described as semiconductor device 40 in FIGS. 18-22 hereinafter.

Blocks S310 and S320 of method 300B are similar to Blocks S310 and S320 of method 300 and the details of the steps will not be repeated again here.

Figure 18:
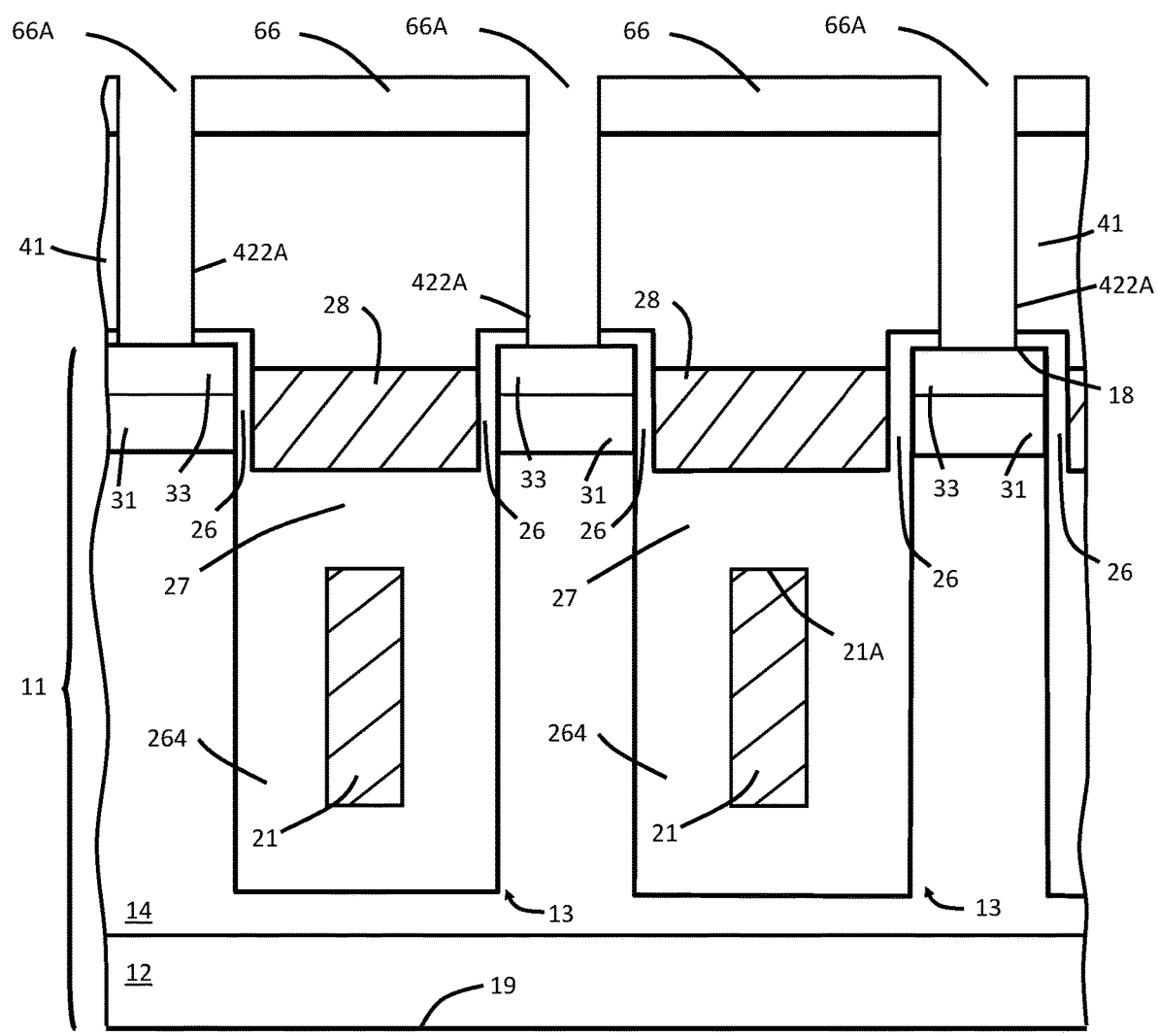
FIGS. 18, 19, 20, 21, and 22 illustrate cross-sectional views of a semiconductor device at various stages of processing in accordance with the method of FIG. 17.

Block S330B of method 300B comprises forming a first part of source/body contact openings by selectively removing portions of the ILD. In some examples, this includes providing a mask 66 over ILD structure 41 having openings 66A as shown in FIG. 18, which illustrates a cross-sectional view of semiconductor device 40 after further processing. Openings 66A correspond to where conductive regions 43A will be formed to provide source/body contacts for semiconductor device 40. In some examples, mask 66 comprises a photo-mask and can be formed using photo-resist deposition, exposure, and development processes. Next, portions of ILD structure 41 can be removed to provide contact openings 422A, which can expose major surface 18 of region of semiconductor material 11. In some examples, this step also removes any portion of gate dielectric 26 that may be present over major surface 18 as illustrated in FIG. 18. It is understood that block S330B can also be used to form gate contact openings in predetermined location(s) to provide for gate contacts to gate conductor 28.

Figure 19:
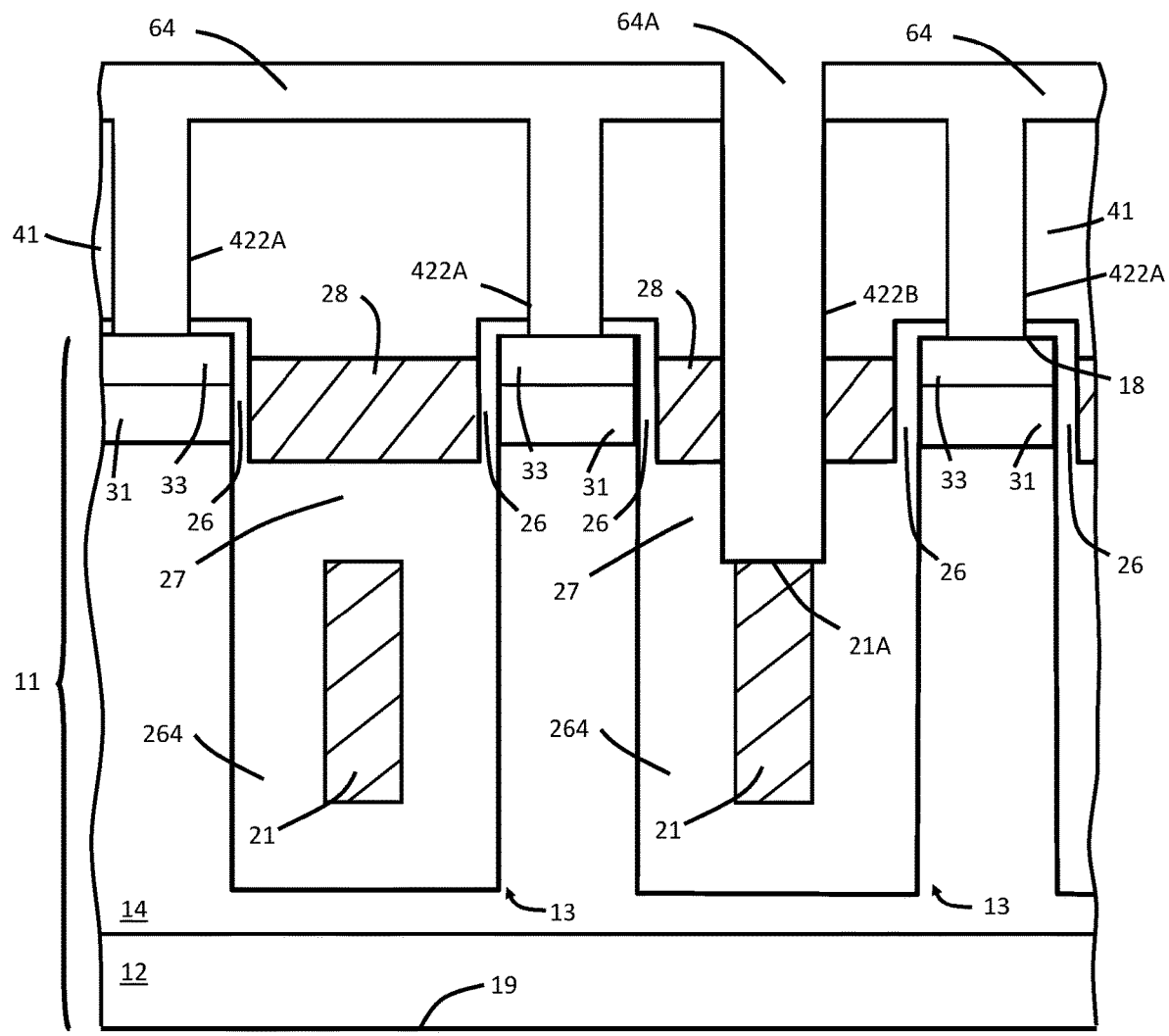

Block S340B of method 300B comprises forming a first part of the shield contact openings by selectively removing portions of the ILD, the gate conductor, and the IPD. In some examples, this includes providing a mask 64 over ILD structure 41 with openings 64A where conductive regions 43B will be formed to provide shield contacts to shield electrodes 21 as shown in FIG. 19, which is a cross-sectional view of semiconductor device 40 after further processing. In some examples, mask 64 comprises a photo-mask and can be formed using photo-resist deposition, exposure, and development processes. Next, portions of ILD structure 41, gate conductor 28, and IPD 27 can be removed to provide contact opening 422B, which can expose upper surface 21A of shield electrode 21. In some examples, dry or wet etching techniques can be used to remove the different materials. In some examples, mask 64 can then be removed after contact openings 422B are provided.

Figure 20:
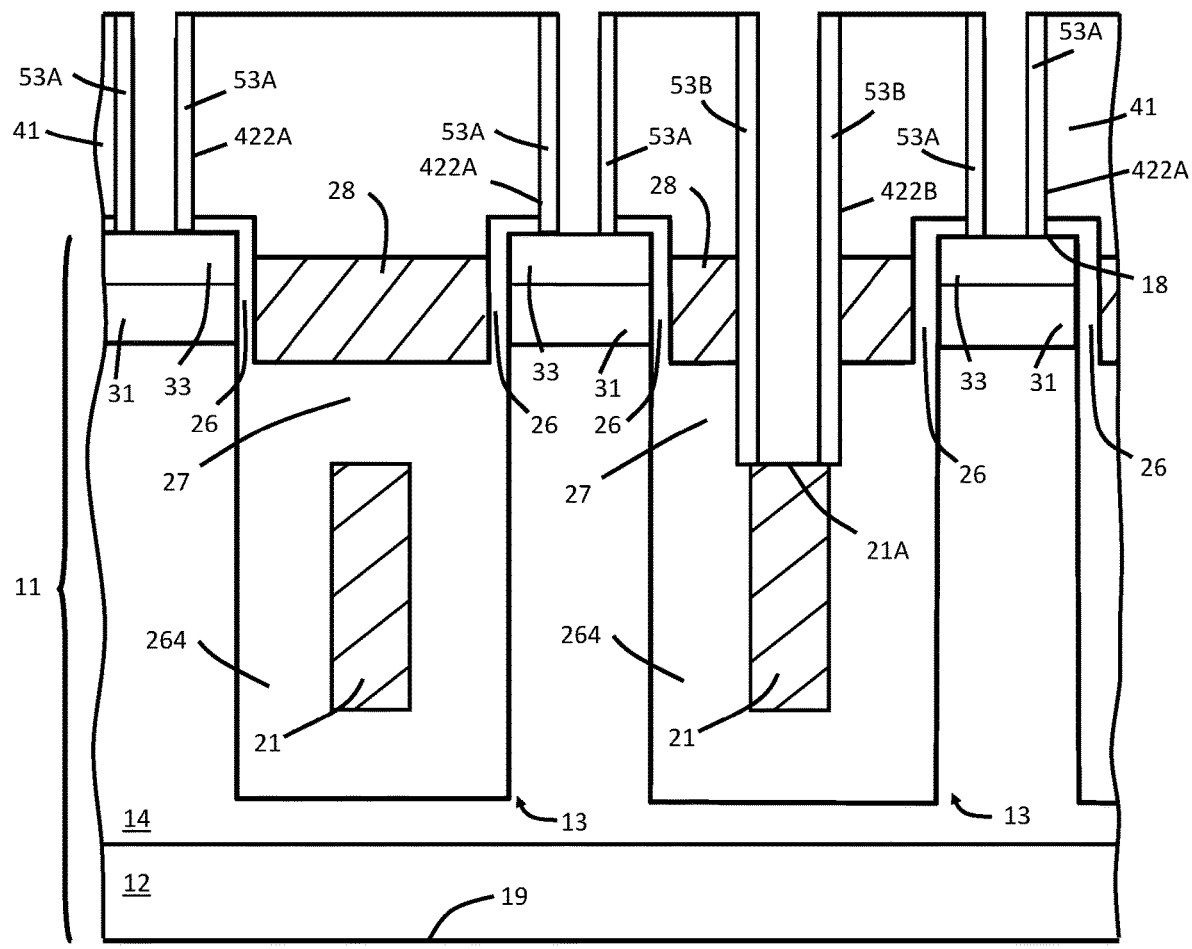

Block S350A of method 300B comprises forming ILD spacers within the shield contact openings and the first part of the source/body contact openings. In some examples, this can include forming dielectric spacers 53A within contact openings 422A and dielectric spacers 53B within contact openings 422B as illustrated in FIG. 20, which is a cross-sectional view of semiconductor device 40 after further processing. In some examples, a dielectric is formed overlying ILD structure 41 and within contact openings 422A and 422B. The dielectric has a thickness so as to not completely fill contact openings 422A or 422B. The dielectric can comprise oxides, nitrides, other insulating materials as known to one of ordinary skill in the art, or combinations thereof. The dielectric can be formed using CVD, PECVD, LTO processes, or other processes as known to one of ordinary skill in the art. After the dielectric is formed, an anisotropic etch can be used to remove portions of the dielectric along the upper surface 21A of shield electrode 28, the upper surface of ILD structure 41 and the exposed portions of major surface 18. The remaining dielectric provides dielectric spacers 53A and dielectric spacers 53B as illustrated in FIG. 20.

Figure 21:
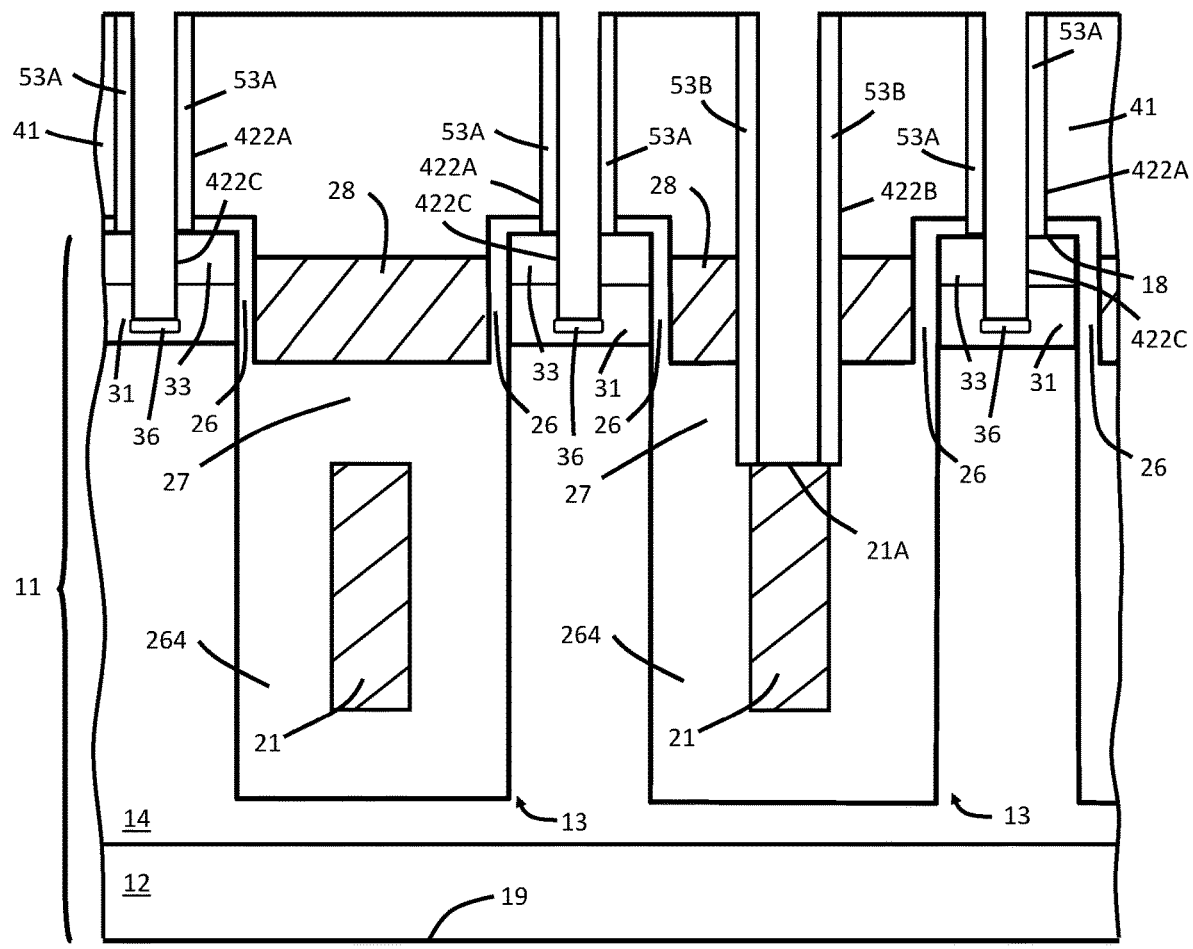

Block 360A of method 300B comprises forming a second part of the source/body contact openings using the ILD spacers to remove a portion of the semiconductor substrate. In some examples, the second part of the source/body contacts can be contact openings 422C as shown in FIG. 21, which is a cross-sectional view of semiconductor device 40 after further processing. In some examples, a fluorine based chemistry can be used to remove potions of region of semiconductor material 11 to provide contact openings 422C extending inward from major surface 18 aligned to dielectric spacers 53A. That is, contact openings 422C are formed using dielectric spacers 53A as a mask. In some examples, contact openings 422C extend past source regions 33 and terminate with body regions 31 of semiconductor device 40.

Block S370A of method 300B is similar to Block S380 of method 300 and comprises forming body enhancement regions proximate to the second source/body contacts with the body regions of the semiconductor substrate. In some examples, ion implantation and anneal processes can be used to form contact regions 36 within body regions 31 as illustrated in FIG. 21, which are configured to enhance the contact characteristics between body regions 31 and conductive regions 43A formed subsequently.

Figure 22:
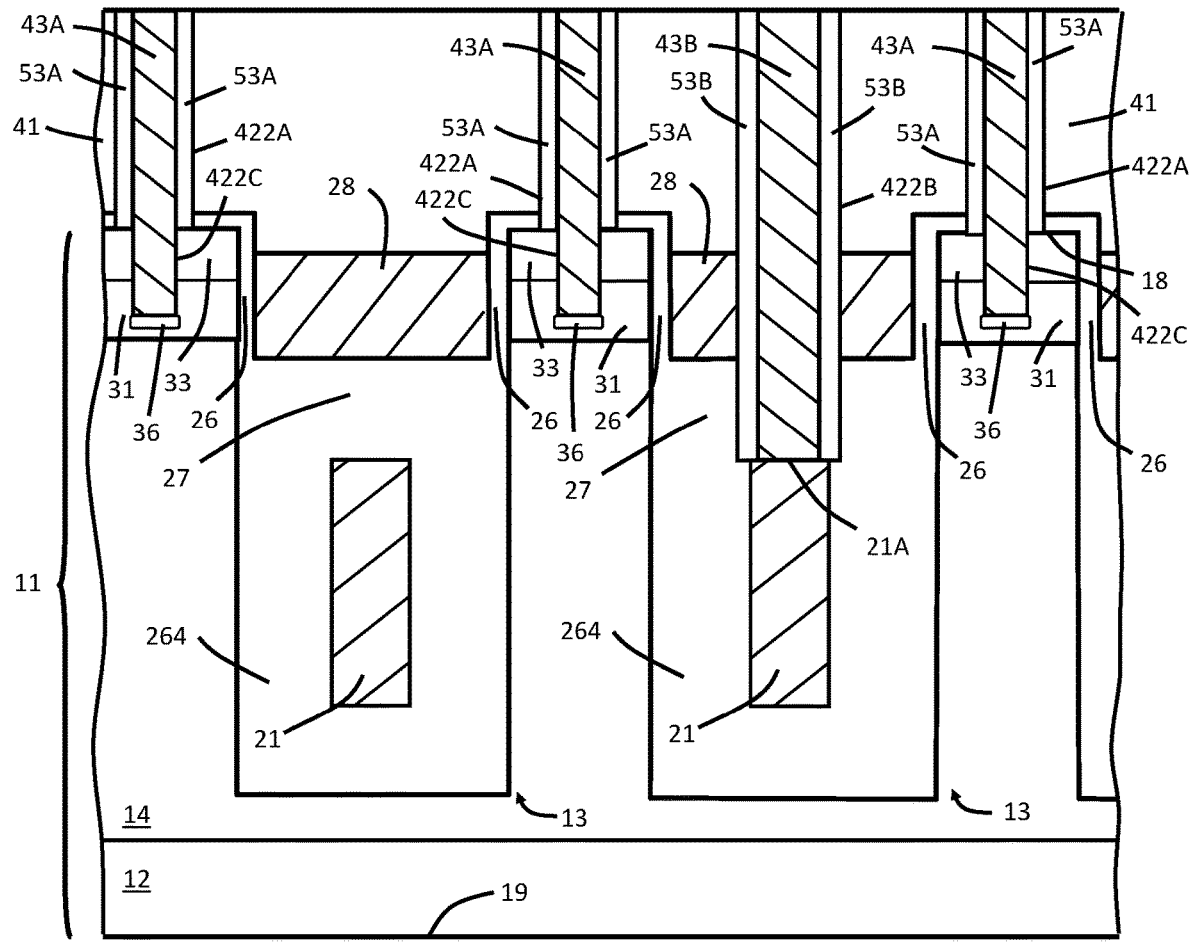

Block 380A of method 300B is similar to Block S390 of method 300 and comprises forming shield contacts within the shield contact openings and source/body contacts within the source/body contact openings. In some examples, this can include conductive regions 43B within contact openings 422B, and conductive regions 43A within contact openings 422A and 422C as shown in FIG. 22, which is a cross-sectional view of semiconductor device 40 after further processing. In some examples, conductive regions 43A and conductive regions 43B can be conductive plugs or plug structures. In some examples, conductive regions 43A and 43B can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. Conductive regions 43A and 43B can be formed using evaporation, sputtering, CVD, or other processes as known to one ordinary skill in the art. In some examples, the conductive fill material includes tungsten. In some examples, conductive regions 43A and 43B can be planarized using CMP processing to provide a more uniform surface topography.

Block S390A of method 300B is similar to Block S395 of method 300 and the details will not be repeated here. It is understood that additional processing of Block S390A of method 300B can be used to provide, among other things, conductive layer 44A and conductive layer 46 as illustrated in FIG. 1 and conductive layer 44B as illustrated in FIG. 9.

Figure 23:
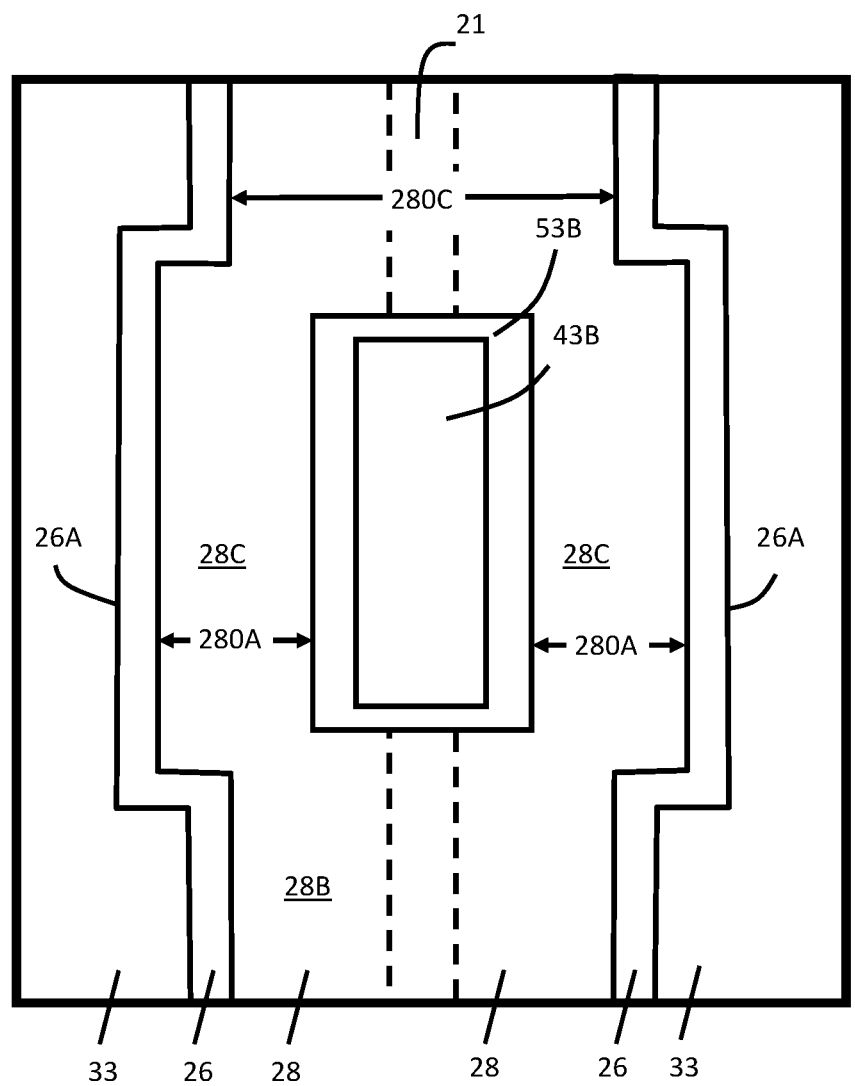
FIG. 23 illustrates a top view of a portion of the semiconductor device in accordance with the present description.

FIG. 23 illustrates a top view of a portion of a semiconductor device 50 to further describe the present configuration. In FIG. 23, one conductive region 43B is illustrated, but it is understood that semiconductor device 50 can comprises multiple conductive regions 43B. In some examples, dielectric spacers 53B completely surround or encompass conductive region 43B. Although conductive regions 43B are illustrated as square shape, it is understood that other shapes, such as circular shapes or shapes with rounded corners can be used.

The example of FIG. 23 is similar to the example of FIG. 2 except in the present example, the shape of gate dielectric 26 is non-linear. More particularly gate dielectric 26 comprises flared out portions 26A that extend laterally away from conductive region 53B. In this way regions 28C of gate conductive 28 on both sides of conductive region 43B have widths 280A and 280B so that when combined, the combined width is closer to a width 280C of 28B of gate conductor 28. In this way, any impact of conductive region 43B on the gate resistance can be reduced. Semiconductor device 50 is another example where gate electrode 28 comprises a shape that surrounds conductive regions 43B in the top view so that gate electrode 28 is uninterrupted by conductive regions 43B and dielectric spacers 53B.

In view of all of the above, it is evident that a novel structure and method are disclosed. Included, among other features, is a semiconductor device having a shielded-gate trench gate electrode structure where contact to the shield electrode is made by making an electrically isolated contact through the gate conductor. In some examples, recesses are periodically provided along gate conductor structures, such as striped gate conductors in manner that does not interrupt electrical communication of the gate conductor structure. More particularly stated, insulated shield contact regions are placed at predetermined locations of the gate conductor structures, and can comprise recesses extending through the gate conductor to the shield electrode. Portions of the gate conductor remain on at least one side of the recesses in a cross-sectional view. In this way, the gate conductor is only partially interrupted by the shield conductor. In some examples, a sufficient amount of gate conductor remains on both sides of the recesses in the cross-sectional view. In this way, the gate conductor provides channel control on both sides of the trench where source and body regions are located. The shield conductor is then provided within the recesses and is isolated from the gate conductor by an insulator. The structures and methods use materials and processes that are compatible in typical semiconductor wafer fabrication facilities and are manufacturable at low costs.

The shield resistance can be tuned in accordance with specific application and design requirements. That is, the shield contacts can be placed in different patterns that are uniform or non-uniform to provide desired resistance effects. The structures and methods are cost effective to implement, which is some examples, only adds one mask layer and an etch step. It was found empirically that structures and methods of the present description have lower shield resistance that improves power conversion efficiency in power conversion applications, such as buck-converter applications.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art. For example, materials for the gate electrodes, shield electrodes, gate conductive layers, and shield conductive layers can comprise one or more materials. When a plurality of materials are used, the materials can be deposited in sequence to provide a laminated structure. In other examples, a first layer can be deposited and patterned (for example, a first spacer portion), and subsequent layers can be deposited and patterned in a similar manner. Conductive materials for the gate and shield structures can include polycrystalline semiconductor materials, silicides, metals, metal-nitrides, metalloids, and other conductive materials as known to one of ordinary skill in the art. Various deposition techniques can be used for the materials, including CVD, PECVD, MOCVD, ALD as well as other deposition techniques known to one of ordinary skill in the art. In addition, the spacers described herein can comprise other materials that provide similar features to those materials described herein. For example, spacers 53A can comprise polycrystalline semiconductor materials, conductive materials, organic dielectrics, printed films, or other materials as known to one of ordinary skill the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device, comprising:
a region of semiconductor material comprising a first major surface and a first conductivity type;
a shielded-gate trench structure comprising:
an active trench extending from the first major surface into the region of semiconductor material;
a shield dielectric layer adjacent to a lower portion of the active trench;
a shield electrode adjacent to the shield dielectric layer in the lower portion of the active trench;
a gate dielectric adjacent to an upper portion of the active trench;
a gate electrode adjacent to the gate dielectric in the upper portion of the active trench; and
an inter-pad dielectric (IPD) interposed between the gate electrode and the shield electrode;
a body region of a second conductivity type opposite to the first conductive type in the region of semiconductor material extending from the major surface adjacent to the shielded-gate trench structure;
a source region of the first conductivity type in the body region adjacent to the shielded-gate trench structure;
an interlayer dielectric (ILD) structure over the first major surface; and
a first conductive region within the active trench and extending through the ILD structure, the gate electrode, and the IPD, wherein:
the first conductive region is coupled to the shield electrode;
the first conductive region is electrically isolated from the gate electrode by a first dielectric spacer; and
the gate electrode comprises a shape that surrounds the first conductive region in a top view so that the gate electrode is uninterrupted by the first conductive region and the first dielectric spacer.

2. The device of claim 1, wherein:
the first conductive region extends to a first depth through the ILD structure, the gate electrode, and the IPD; and
the first dielectric spacer extends to a second depth through the ILD structure, the gate electrode, and the IPD that is less than the first depth.

3. The device of claim 1, wherein:
the first conductive region extends to a first depth through the ILD structure, the gate electrode, and the IPD; and
the first dielectric spacer extends to the first depth.

4. The device of claim 1, further comprising:
a second conductive region extending through the ILD to the body region; and
a spacer interposed between the second conductive region and the ILD structure.

5. The device of claim 4, wherein:
the spacer comprises a second dielectric spacer.

6. The device of claim 1, wherein:
the semiconductor comprises an active area; and
the first conductive region is one of a plurality of first conductive regions.

7. The device of claim 6, wherein:
the plurality of first conductive regions is distributed non-uniformly within the active area.

8. The device of claim 6, wherein:
the plurality of first conductive regions is distributed uniformly within the active area.

9. The device of claim 1, further comprising:
a gate conductive layer interposed between the gate electrode and the ILD structure, wherein:
the first conductive region extends through the gate conductive layer; and
the gate conductive layer and the gate electrode comprise different material.

10. The device of claim 1, further comprising:
a shield conductive layer interposed between the first conductive region and the shield electrode, wherein:
the shield conductive layer and the shield electrode comprise different material.

11. A semiconductor device, comprising:
a region of semiconductor material comprising a first major surface and a first conductivity type;
a shielded-gate trench structure comprising:
an active trench extending from the first major surface into the region of semiconductor material and having a first side and a second side opposite to the first side;
a shield dielectric layer adjacent to a lower portion of the active trench;
a shield electrode adjacent to the shield dielectric layer in the lower portion of the active trench;
a gate dielectric adjacent to an upper portion of the active trench;
a gate electrode adjacent to the gate dielectric in the upper portion of the active trench; and
an inter-pad dielectric (IPD) interposed between the gate electrode and the shield electrode;
a body region of a second conductivity type opposite to the first conductive type in the region of semiconductor material extending from the major surface adjacent to the first side and the second side of the active trench;
a source region of the first conductivity type in the body region adjacent to the first side and the second side of the active trench;
an interlayer dielectric (ILD) structure over the first major surface;
a first conductive region within the active trench and extending through the ILD structure, the gate electrode, and the IPD; and
a second conductive region extending through the ILD structure and the source region, wherein:
the first conductive region is coupled to the shield electrode;
the first conductive region is electrically isolated from the gate electrode by a first dielectric spacer; and
the gate electrode comprises a shape in a top view that surrounds each side of the first conductive region in the top view.

12. The device of claim 11, further comprising a spacer interposed between the second conductive region and the ILD structure.

13. The device of claim 12, wherein:
the spacer comprises a second dielectric spacer; and
the first dielectric spacer and the second dielectric spacer comprise a same material.

14. The device of claim 11, wherein:
the semiconductor comprises an active area; and
the first conductive region is one of a plurality of first conductive regions within the active area.

15. The device of claim 14, wherein:
the plurality of first conductive regions is distributed non-uniformly within the active area.

16. The device of claim 11, further comprising:
a shield conductive layer interposed between the first conductive region and the shield electrode; and
a gate conductive layer interposed between the gate electrode and the ILD structure, wherein:
the first conductive region extends through the gate conductive layer.

17. A method of forming a semiconductor device, comprising:
providing a region of semiconductor material comprising a first major surface and a first conductivity type;
providing a shielded-gate trench structure comprising:
an active trench extending from the first major surface into the region of semiconductor material and having a first side and a second side opposite to the first side;
a shield dielectric layer adjacent to a lower portion of the active trench;
a shield electrode adjacent to the shield dielectric layer in the lower portion of the active trench;
a gate dielectric adjacent to an upper portion of the active trench;
a gate electrode adjacent to the gate dielectric in the upper portion of the active trench; and
an inter-pad dielectric (IPD) interposed between the gate electrode and the shield electrode;
providing a body region of a second conductivity type opposite to the first conductive type in the region of semiconductor material extending from the major surface adjacent to the first side and the second side of the active trench;
providing a source region of the first conductivity type in the body region adjacent to the first side and the second side of the active trench;
providing an interlayer dielectric (ILD) structure over the first major surface;
providing a first conductive region within the active trench and extending through the ILD structure, the gate electrode, and the IPD; and
providing a second conductive region extending through the ILD structure and the source region, wherein:
the first conductive region is coupled to the shield electrode;
the first conductive region is electrically isolated from the gate electrode by a first dielectric spacer; and
the gate electrode comprises a shape in a top view that surrounds each side of the first conductive region in the top view.

18. The method of claim 17, wherein:
providing the first conductive region comprises:
forming a first contact opening extending through the ILD structure, the gate conductor, and at least a portion of the IPD;
forming the first dielectric spacer within the first contact opening; and
providing a conductive material adjacent to the first dielectric spacer within the first contact opening; and
providing the second conductive region comprises
forming a second contact opening extending through the ILD structure and the source region;
forming a second dielectric spacer within the second contact opening; and
providing the conductive material adjacent the second dielectric spacer within the second contact opening.

19. The method of claim 18, wherein:
forming the first contact opening and forming the first dielectric spacer occurs before forming the second contact opening.

20. The method of claim 17, further comprising:
providing a shield conductive layer interposed between the first conductive region and the shield electrode; and
providing a gate conductive layer interposed between the gate electrode and the ILD structure, wherein:
the first conductive region extends through the gate conductive layer.

* * * * *